US012641905B2

(12) United States Patent
Goto et al.

(10) Patent No.: US 12,641,905 B2
(45) Date of Patent: May 26, 2026

(54) STACKED SEMICONDUCTOR DEVICE WITH CONNECTION PAD DISPOSED BETWEEN CONNECTION PAD SHIELDS

(71) Applicant: OMNIVISION TECHNOLOGIES, INC., Santa Clara, CA (US)

(72) Inventors: Takayuki Goto, Foster City, CA (US); Kazufumi Watanabe, Mountain View, CA (US); Rui Wang, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 569 days.

(21) Appl. No.: 18/136,762

(22) Filed: Apr. 19, 2023

(65) Prior Publication Data

US 2024/0355858 A1 Oct. 24, 2024

(51) Int. Cl.
*H10F 39/00* (2025.01)
*H10W 72/90* (2026.01)
(Continued)

(52) U.S. Cl.
CPC ......... *H10F 39/811* (2025.01); *H10F 39/809* (2025.01); *H10W 72/926* (2026.01);
(Continued)

(58) Field of Classification Search
CPC .. H10F 39/809; H10F 39/811; H10F 39/8057; H10F 39/018; H10F 39/199;
(Continued)

(56) References Cited

U.S. PATENT DOCUMENTS

| | | | |
|---|---|---|---|
| 8,669,602 | B2 | 3/2014 | Hayashi |
| 9,165,968 | B2 | 10/2015 | Chao et al. |

(Continued)

FOREIGN PATENT DOCUMENTS

| | | | |
|---|---|---|---|
| JP | 2021052210 A | 4/2021 | |

OTHER PUBLICATIONS

Grill et al., Progress in the development and understanding of advance low k and ultralow k dielectrics for very large-scale integrated interconnects—State of the art, Appl. Phys. Rev 1, 2014, https://doi.org/10.1063/1.4861876, 18 pages.
(Continued)

*Primary Examiner* — Didarul A Mazumder
(74) *Attorney, Agent, or Firm* — Christensen O'Connor Johnson Kindness PLLC

(57) ABSTRACT

A stacked semiconductor device comprising a first semiconductor substrate, a second semiconductor substrate, an insulating medium disposed between the first semiconductor substrate and the second semiconductor substrate, a plurality of connection pads including a first connection pad and a second connection pad, a first connection pad shield structure, and a second connection pad shield structure. The plurality of connection pads is disposed within the insulating medium and configured to provide one or more electrical connections extending between the first semiconductor substrate and the second semiconductor substrate. The first connection pad is disposed between the first connection pad shield structure and the second connection pad shield structure.

20 Claims, 14 Drawing Sheets

(51) Int. Cl.

| | | |
|---|---|---|
| *H10W 80/00* | (2026.01) | |
| *H10W 90/00* | (2026.01) | |

(52) U.S. Cl.

CPC ........ *H10W 72/931* (2026.01); *H10W 72/932* (2026.01); *H10W 72/936* (2026.01); *H10W 72/9415* (2026.01); *H10W 72/9445* (2026.01); *H10W 72/952* (2026.01); *H10W 72/957* (2026.01); *H10W 80/701* (2026.01); *H10W 80/754* (2026.01); *H10W 90/792* (2026.01)

(58) Field of Classification Search

CPC ..... H10F 39/12; H01L 25/167; H01L 23/552; H01L 24/08; H01L 24/05; H01L 24/80; H01L 24/09; H01L 21/768; H01L 2224/08145; H04N 25/78; H04N 25/79; H10W 72/926; H10W 72/931; H10W 72/936; H10W 90/792

USPC ........... 257/443; 438/48, 66, 67, 73, 80, 982

See application file for complete search history.

(56) References Cited

U.S. PATENT DOCUMENTS

| | | | |
|---|---|---|---|
| 10,062,722 | B2 | 8/2018 | Manabe et al. |
| 10,665,623 | B2 | 5/2020 | Suzuki et al. |
| 11,233,088 | B2 | 1/2022 | Chen et al. |
| 2018/0121205 | A1 | 5/2018 | Boersma et al. |
| 2019/0252444 | A1 | 8/2019 | Ryoki et al. |
| 2020/0243590 | A1 | 7/2020 | Yamagishi et al. |
| 2021/0175324 | A1* | 6/2021 | Ogino ................. H10D 62/405 |
| 2021/0368127 | A1 | 11/2021 | Lee |
| 2022/0199670 | A1* | 6/2022 | Jang ...................... H10F 39/809 |
| 2022/0352235 | A1* | 11/2022 | Ogura .................... H10F 39/12 |
| 2024/0120312 | A1 | 4/2024 | Ryan |
| 2024/0332333 | A1* | 10/2024 | Yang ....................... H01L 24/08 |
| 2024/0347576 | A1 | 10/2024 | Yang et al. |

OTHER PUBLICATIONS

Kagawa et al., An Advanced CuCu Hybrid Bonding for Novel Stacked CMOS Image Sensor, 2018, IEEE 2nd Electron Devices Technology and Manufacturing Conference, 3 pages.

Kagawa et al., Impacts of Misalignment on 1 µm Pitch Cu—Cu Hybrid Bonding, 2020 IEEE International Interconnect Technology Conference, 2020, 3 pages.

Kagawa et al., The Scaling of Cu—Cu Hybrid Bonding for High Density 3D Chip Stacking, 2019 Electron Devices Technology and Manufacturing Conference, 3 pages.

U.S. Appl. No. 17/886,945, filed Aug. 12, 2022, 76 pages.

U.S. Appl. No. 17/886,955, filed Aug. 12, 2022, 91 pages.

U.S. Appl. No. 18/136,757, filed Apr. 19, 2023, 92 pages.

Non-Final Office Action issued Aug. 12, 2025 in corresponding U.S. Appl. No. 18/136,757, filed Apr. 19, 2023, 23 pages total.

Final Office Action issued Dec. 18, 2025 in corresponding U.S. Appl. No. 18/136,757, filed Apr. 19, 2023, 21 pages total.

* cited by examiner

300

STACKED SEMICONDUCTOR DEVICE WITH CONNECTION PAD DISPOSED BETWEEN CONNECTION PAD SHIELDS

TECHNICAL FIELD

This disclosure relates generally to image sensors, and in particular but not exclusively, relates to CMOS image sensors and applications thereof.

BACKGROUND INFORMATION

Image sensors are one type of semiconductor device that have become ubiquitous and are now widely used in digital cameras, cellular phones, security cameras, as well as, medical, automobile, and other applications. As image sensors are integrated into a broader range of electronic devices it is desirable to enhance their functionality, performance metrics, and the like in as many ways as possible (e.g., resolution, power consumption, dynamic range, size, etc.) through both device architecture design as well as image acquisition processing. However, it is appreciated that many of these metrics are inversely related. For example, pixel size may be increased to improve dynamic range but have increased noise. In another example, resolution may be increased by increasing the number of pixels, but if pixel size is maintained then the physical size of the image sensor increases. Accordingly, improving one or more performance metrics of semiconductor devices such as image sensors while mitigating adverse effects on other performance metrics remains challenging.

The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bit lines that vary as a function of the incident image light. In other words, the amount of image charge generated is proportional to the intensity of the image light, which is readout as analog image signals from the column bit lines and converted to digital values to produce digital images (i.e., image data) representative of the external scene.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described.

DETAILED DESCRIPTION

Figure 1A:
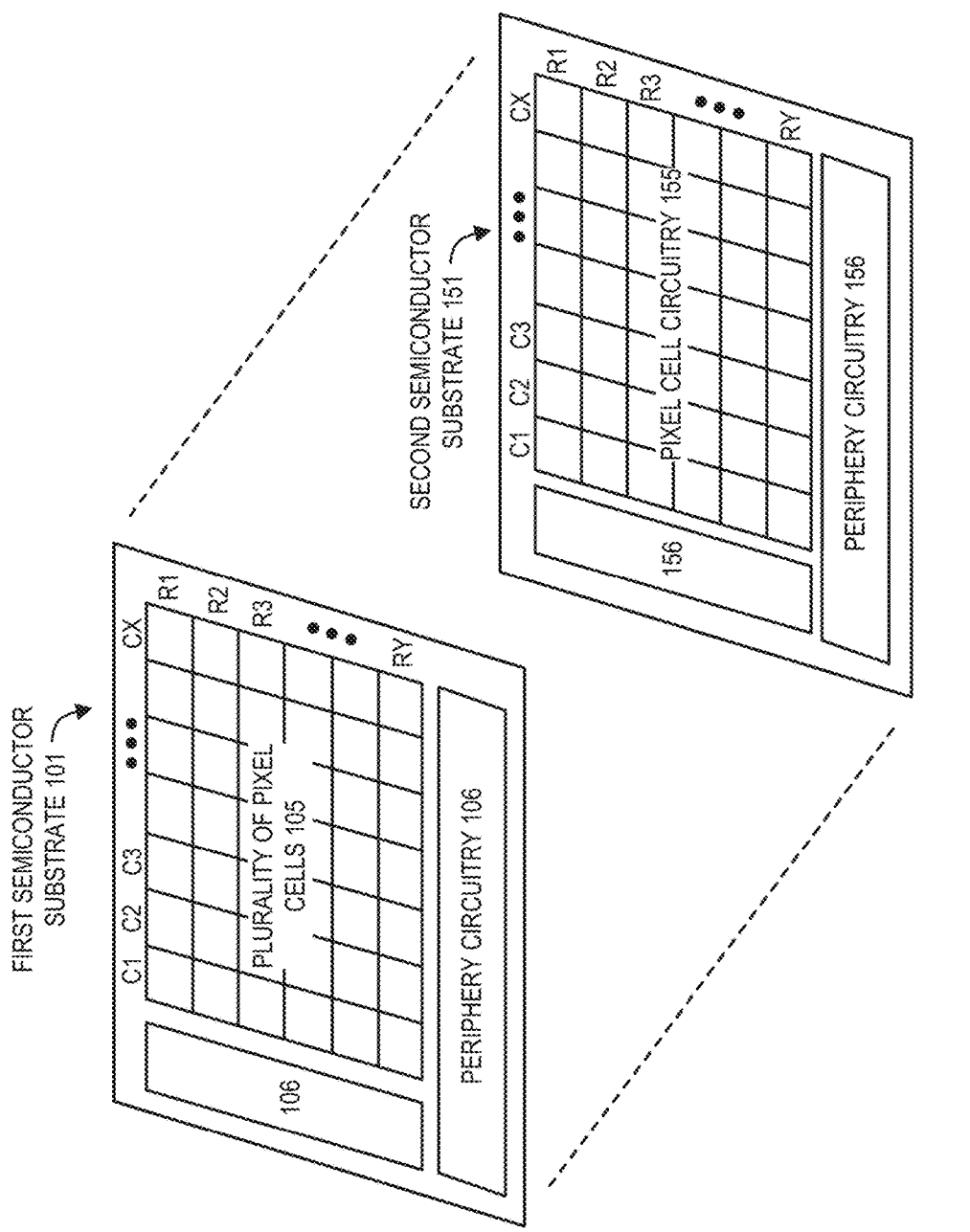
FIG. 1A illustrates an example stacked semiconductor device with connection pad shield corresponding to an imaging system, in accordance with embodiments of the present disclosure.

Embodiments of an apparatus, system, and method each related to a stacked semiconductor device with a connection pad shield are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Described herein are embodiments of, or otherwise related to, a stacked semiconductor device with a connection pad shield. In most embodiments, the stacked semiconductor device will be discussed in the context of being a multi-substrate image sensor. However, it is appreciated that the benefits and advantages of the stacked pixel-level or pixel cell-level connection pad shield configuration are not limited to only multi-substrate image sensors. Rather, one having the benefit of the disclosure will understand that the other stacked semiconductor devices (e.g., integrated circuits with a three-dimensional structure including, but not limited to, memory devices, processing devices, multi-chip systems, or other semiconductor devices utilizing two or more vertically stacked semiconductor substrates) may also take advantage of the connection pad shield configurations described in embodiments herein. Specifically, embodiments described herein disclose an insulating medium disposed between a first semiconductor substrate (e.g., a first die or wafer) and a second semiconductor substrate (e.g., a second die or wafer) to facilitate electrical coupling between components located in or on different semiconductor substrates (e.g., to electrically couple a first component located in or on the first semiconductor substrate to a second component located in or on the second semiconductor substrate). The insulating medium includes a plurality of connection pads and a plurality of connection pad shield (CPS) structures interspersed between the plurality of connection pads (e.g., a first CPS structure included in the plurality of CPS structures is laterally disposed between a first connection pad included in the plurality of connection pads and a second connection pad included in the plurality of connection pads). The specific arrangement, size, shape, position, and composition of the plurality of connection pads and the plurality of CPS structures within the insulating medium are configured to address inter alia, the problem of crosstalk (e.g., electrical coupling such as capacitive coupling and/or inductive coupling) between adjacent connection pads included in the plurality of connection pads while maintaining compatibility with high density cross-substrate interconnections (e.g., pitch or separation distance between adjacent CPS structures may have an upper bound of 1 µm or less, 0.9 µm or less, 0.8 µm or less, 0.7 µm or less, 0.6 µm or less, 0.5 µm or less, 0.4 µm or less, 0.3 µm or less, or 0.2 µm or less while having a lower bound compatible with the critical dimension of the processing node utilized to fabricate the stacked semiconductor device).

It was found that as pitch between adjacent connection pads included in the plurality of connection pads decreases, crosstalk may increase to the extent to have a detrimental effect on readout (e.g., measurement of analog signals propagating between stacked semiconductor substrates via the plurality of connection pads may be adversely affected in the presence of significant crosstalk). This issue of crosstalk due, at least in part, to capacitive or inductive coupling, is particularly pertinent for image sensors described in embodiments of the disclosure in which pixel-level or pixel cell-level hybrid bonding is desired such that individual pixels or groups of pixels may be read out across substrates in a timely and accurate manner. For example, in some embodiments, photosensitive elements (e.g., photodiodes such as pinned photodiodes) may be disposed on the first semiconductor substrate while circuitry for readout (e.g., one or more transistors such as transfer transistors, source-follower transistors, reset transistors, row-select transistors, and the like) may be distributed across multiple substrates such that the photodiode occupancy area or fill factor of the first semiconductor substrate may be increased. However, in offloading at least some of the readout circuitry to a secondary or tertiary substrate, the number of interconnections (e.g., hybrid bonds) between stacked substrates becomes directly related to the readout speed of the image sensor. For example, it may be desirable to match the number of interconnections to be equal to or greater than the number of pixels or pixel cells associated with the image sensor to achieve a targeted readout speed. However, it was found that as the density of interconnections per unit area is increased, crosstalk is adversely affected (e.g., as the pitch or separation distance between adjacent interconnections decreases the degree of crosstalk between the adjacent interconnections increases). Described herein are embodiments of the disclosure capable of mitigating increased crosstalk that occurs with decreased pitch between interconnections spanning multiple substrates.

Advantageously, embodiments of the disclosure can be utilized to fabricate stacked semiconductor devices, such as image sensors with a submicron range pixel pitch, such as less than 0.5 µm, while mitigating crosstalk that may otherwise adversely impact device operation (e.g., readout) and/or performance. In some embodiments, this is achieved via a plurality of CPS structures interspersed with a plurality of connection pads disposed within an insulating medium such that CPS structures are laterally disposed between adjacent connection pads included in the plurality of connection pads. In the same or other embodiments, one or more of the CPS structures may be coupled to a power terminal to receive a pre-determined bias or voltage (e.g., ground, $V_{DD}$, or a different bias or voltage) to provide additional crosstalk mitigation. It is appreciated that in some embodiments, the plurality of CPS structures may be arranged or otherwise structured to provide various advantageous effects (e.g., improved shielding, reduced size, compensate for processing variance, other advantageous effects explicitly mentioned or otherwise, or combinations thereof). It is further appreciated that the term "semiconductor substrate" throughout the disclosure may correspond to a part of or an entirety of a semiconductor wafer (e.g., a silicon wafer). In some embodiments, the semiconductor substrate includes or is otherwise formed of silicon, a silicon germanium alloy, germanium, a silicon carbide alloy, an indium gallium arsenide alloy, any other alloys formed of III-V group compounds, combinations thereof, or a bulk substrate thereof. Additionally, it is appreciated that the term "hybrid bond" refers to one or more interconnections formed via a direct bond interconnect process by which metal surfaces (e.g., Au, Cu, Al, metal alloys, other metals, and/or combinations thereof) disposed within an insulating matrix or medium of two or more semiconductor substrates are placed in direct contact and permanently affixed together. In some embodiments, the metal surfaces are initially adhered together via Van der Waals bonds between the metal surfaces. One or more thermal processes may then be applied to convert the Van der Waals bonds to covalent and/or metallic bonds to permanently affix the two or more semiconductor substrates together. It is further appreciated that the one or more thermal processes may also result in bonding between one or more of the metal surfaces and the insulating medium and/or between insulating mediums on the two or more semiconductor substrates.

FIG. 1A illustrates an example stacked semiconductor device with connection pad shield corresponding to imaging system 100, in accordance with embodiments of the present disclosure. The imaging system 100 corresponds to an image sensor for imaging an external scene. The imaging system 100 includes a first semiconductor substrate 101 and a second semiconductor substrate 151, each of which may correspond to a part of or an entirety of a semiconductor wafer in accordance with embodiments of the disclosure. The first semiconductor substrate 101 includes a plurality of pixel cells 105 and periphery circuitry 106. In some embodiments, each pixel cell included in the plurality of pixel cells 105 includes one or more pixels (see, e.g., FIG. 1). In some embodiments, individual pixel cells included in the plurality of pixel cells 105 may be associated with two or more pixels sharing a common color filter or otherwise be optically aligned with color filters having a common spectral photoresponse (e.g., a group of four adjacent pixels arranged in a two-by-two pattern may be optically aligned with a first color filter to form a first pixel cell included in the plurality of pixel cells 105). In other embodiments, the plurality of pixel cells 105 may include exactly one pixel and adjacent pixels may be associated with color filters having different spectral photoresponses. The second semiconductor substrate 151 includes pixel cell circuitry 155 and periphery circuitry 156. In some embodiments, the pixel cell circuitry 155 may be segmented into groups of components that are associated with respective pixel cells included in the plurality of pixel cells 105 to facilitate operation and/or readout for the imaging system 100 (see, e.g., FIG. 3A), which may be physically aligned or otherwise overlap across substrates (e.g., components for readout circuitry for a given pixel cell included in the plurality of pixel cells 105 located in or on the second semiconductor substrate 151 may vertically overlap with the given pixel cell located in or on the first semiconductor substrate 101).

In the illustrated embodiment of FIG. 1A, the imaging system 100 is a complementary metal-oxide semiconductor (CMOS) image sensor formed, at least in part, by the first semiconductor substrate 101 (e.g., a first die) and the second semiconductor substrate 151 (e.g., a second die) that are stacked and coupled together (e.g., electrically and physically) in a stacked chip scheme achieved, at least in part, via hybrid bonding on a per-pixel or per-pixel cell basis. It is appreciated that other types of bonding (e.g., oxide bonding, metal bonding), silicon connections (e.g., through silicon vias), other suitable circuit coupling technologies, or combinations thereof may also be utilized in combination with hybrid bonding to form the imaging system 100. It is appreciated that while only the first semiconductor substrate 101 and the second semiconductor substrate 151 are illustrated in FIG. 1A, the stacked chip scheme of the imaging system 100 may include additional substrates (e.g., one or more additional substrates, dies, or chips different from the first semiconductor substrate 101 and the second semiconductor substrate 151) that may be integrated into the stacked chip scheme of the imaging system 100. Additionally, it is appreciated that the view presented in FIG. 1A may omit certain elements of the imaging system 100 to avoid obscuring details of the disclosure. In other words, not all elements of the imaging system 100 may be labeled, illustrated, or otherwise shown within FIG. 1A or other figures throughout the disclosure. It is further appreciated that in some embodiments, the imaging system 100 may not necessarily include all elements shown.

Referring to the illustrated embodiment of FIG. 1A, the stacked chip scheme distributes components of the imaging system 100 across multiple substrates. Specifically, the first semiconductor substrate 101 includes photosensitive elements (e.g., a plurality of photodiodes such as pinned photodiodes or the like to form pixels) included in a plurality of pixel cells 105 while the second semiconductor substrate 151 includes pixel cell circuitry 155 associated with the plurality of pixel cells 105 (e.g., any one of or a combination of pixel transistors such as reset transistors, source-follower transistors, row select transistors, and so on, analog to digital circuitry, signal processing circuitry, or other circuitry to facilitate imaging an external scene with the pixels included in the plurality of pixel cells 105). Put in another way, the second semiconductor substrate 151 offloads at least part of the circuitry associated with the plurality of pixel cells 105 from the first semiconductor substrate 101, which advantageously provides additional space on the first semiconductor substrate 101 (e.g., to reduce pixel pitch, increase photodiode sensing area relative to total pixel area, and so on).

In embodiments of the disclosure, the plurality of pixel cells 105 may be coupled to the pixel cell circuitry 155 through a plurality of connection pads embedded in an insulating medium or matrix. It is appreciated that the plurality of connection pads may be positioned at a bonding interface where the first semiconductor substrate 101 and the second semiconductor substrate 151 physically contact one another. One or more connection vias, metal wires, lines, or traces, contacts, or combinations thereof (e.g., interconnects) may further electrically couple the plurality of connection pads to various components (e.g., floating diffusion regions) located in or on the first semiconductor substrate 101 and/or the second semiconductor substrate 151. In some embodiments, the space saved on the first semiconductor substrate 101 by offloading circuitry to the second semiconductor substrate 151 (or other subsequent substrates in the stacked chip scheme) may be repurposed to increase the size of individual photodiodes included in each of the pixels of the plurality of pixel cells 105 to allow for increased pixel size, density, sensitivity, combinations thereof, or the like. Additionally, or alternatively, functionality of the imaging system 100 may be enhanced as the second semiconductor substrate 151 may have room for additional components or circuitry that may not otherwise fit on an individual substrate that contains both the plurality of pixel cells 105 and the pixel cell circuitry 155 without affecting the performance and/or functionality of the imaging system 100.

In the illustrated embodiment, imaging system 100 comprises the first semiconductor substrate 101 and the second semiconductor substrate 151 coupled to the first semiconductor substrate 101. The first semiconductor substrate 101 includes the plurality of pixel cells 105, which are arranged in rows (e.g., R1, R2, R3, . . . RY) and columns (e.g., C1, C2, C3, . . . CX) to form an array of pixel cells. Each of the plurality of pixel cells 105 may include any number of pixels (e.g., one, two, four, eight, or more pixels per pixel cell). In most embodiments, the number of pixels per pixel cell included in the plurality of pixel cells 105 is uniform. In one embodiment, each pixel cell included in the plurality of pixel cells 105 has a regular arrangement (e.g., a two-by-two arrangement of four pixels, a two-by-three arrangement of six pixels, a two-by-four arrangement of eight pixels, a four-by-four arrangement of sixteen pixels, or otherwise). In some embodiments, an individual pixel cell included in the plurality of pixel cells 105 may correspond to a minimal repeating unit of the first semiconductor substrate 101, or more specifically, the plurality of pixel cells 105. In other embodiments, a group of pixel cells included in the plurality of pixel cells 105 may correspond to a minimal repeating unit of the first semiconductor substrate 101 and/or the plurality of pixel cells 105 (e.g., a two-by-two group of pixel cells included in the plurality of pixel cells 105 may correspond to a minimal repeating unit). In some embodiments, the pixel cell circuitry 155 of the second semiconductor substrate 151 is arranged based on a corresponding arrangement of the plurality of pixel cells 105. For example, in some embodiments, individual pixel cells included in the plurality of pixel cells 105 of the first semiconductor substrate 101 may be respectively coupled to individual groups of components included in the pixel cell circuitry 155 of the second semiconductor substrate 151 on a per-pixel or per-pixel cell basis, which may result in an arrangement of the pixel cell circuitry 155 being regular and/or repeating (e.g., in rows and columns as illustrated).

As illustrated in FIG. 1A, the first semiconductor substrate 101 and the second semiconductor substrate 151 include various analog and/or digital support circuitry for the imaging system 100, respectively corresponding to the periphery circuitry 106 and the periphery circuitry 156. In some embodiments, support circuitry that may be included in the periphery circuitry 106 and/or the periphery circuitry 156 may include, but is not limited to, row and column decoders and drivers, analog signal processing chains, digital imaging processing blocks, memory, timing and control circuits, input/output interfaces, a vertical scanner, sample and hold circuitry, amplifiers, analog-to-digital converter circuitry, and any other embodiments of logic and/or circuitry that is appropriate for the function of the imaging system 100.

Figure 1B:
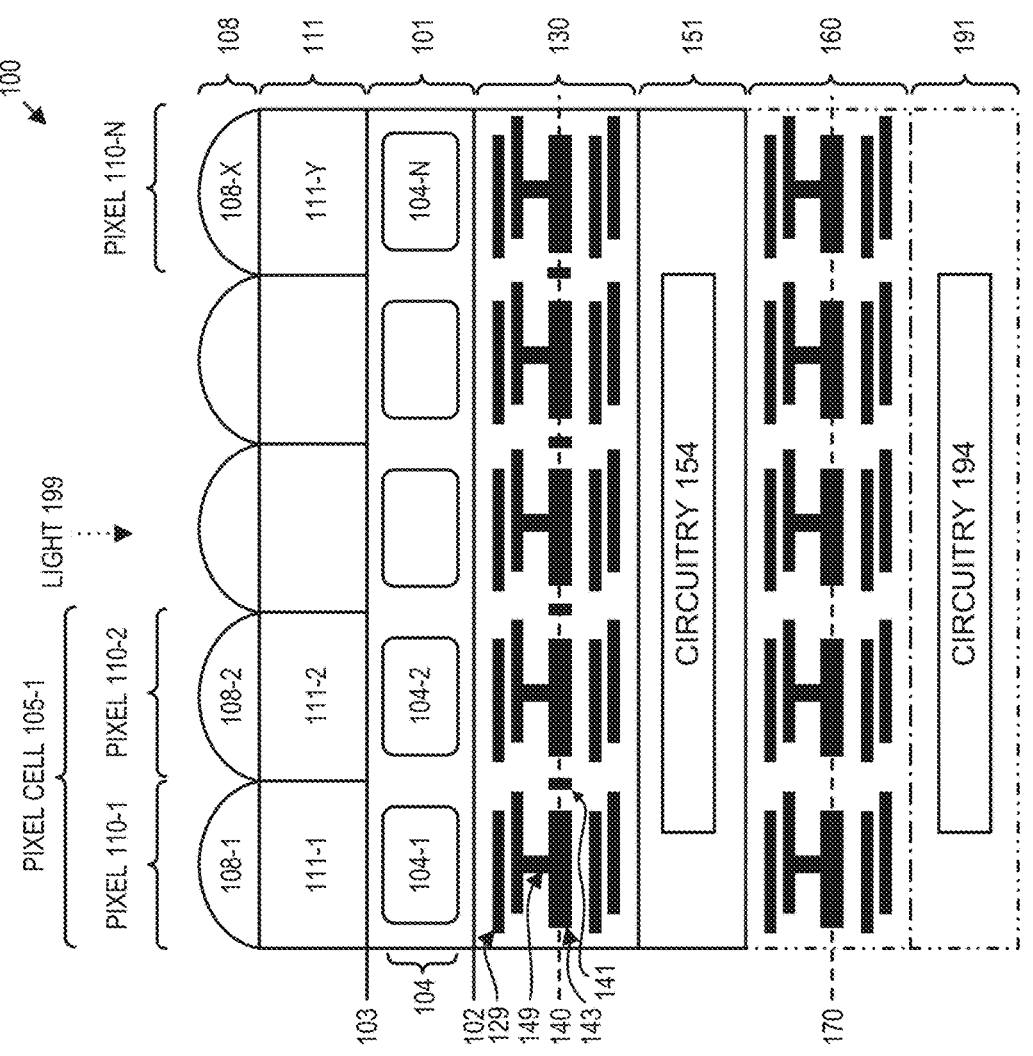
FIG. 1B illustrates a cross-sectional view of the example imaging system of FIG. 1A, in accordance with an embodiment of the present disclosure.

FIG. 1B illustrates a cross-sectional view of the example imaging system 100 of FIG. 1A, in accordance with an embodiment of the present disclosure. The imaging system 100 includes the first semiconductor substrate 101, the second semiconductor substrate 151, and optionally a third semiconductor substrate 191. As illustrated, the second semiconductor substrate 151 is disposed between the first semiconductor substrate 101 and the optional third semiconductor substrate 191. It is appreciated that additional semiconductor substrates (not illustrated) may further be included in the stacked chip scheme of the imaging system 100. The first semiconductor substrate 101 is coupled to the second semiconductor substrate 151 at a bonding interface 140 included in insulating medium 130. In other words, bonding interface 140 corresponds to where a first die or wafer (e.g., the first semiconductor substrate 101 and constituent components formed therein or on) is brought into contact with a second die or wafer (e.g., the second semiconductor substrate 151 and constituent components formed therein or on). The insulating medium 130 includes one or more insulating layers (e.g., one or more intra- and/or inter-metal dielectrics such as silicon dioxide, organosilicate glass such as SiCOH, porous SiCOH, other insulating materials, or combinations thereof), one or more metal lines or wires 129 (e.g., Au, Al, Cu, W, one or more alloys such as an aluminum alloy, other conductive materials, or combinations thereof) that form hierarchical levels, one or more connection vias 149 (e.g., Au, Al, Cu, W, Ru, one or more alloys such as an aluminum alloy, other conductive materials, or combinations thereof), a plurality of connection pads 143 (Cu or any other conductive material capable of bonding with itself via metallic bonding, one or more insulating materials via covalent bonding, or other type of bonding), and a plurality of connection pad shield (CPS) structures 141 (e.g., Au, Al, Cu, W, one or more alloys such as an aluminum alloy, other conductive materials, or combinations thereof). It is appreciated that in most embodiments, the plurality of connection pad shield (CPS) structures 141 and the plurality of connection pads 143 may have an identical material composition (e.g., formed of the same material and in the same process) for consideration of processing complexity and fabrication cost.

In some embodiments, the plurality of connection pads 143 electrically couple components located on different substrates (e.g., a first component located in or on the first semiconductor substrate 101 may be electrically coupled to a second component located in or on the second semiconductor substrate 151 via one a given connection pad included in the plurality of connection pads 143). The one or more metal lines 129 and one or more connection vias 149 may facilitate the cross-substrate electrical coupling providing vertical and lateral routing through the insulating medium 130. The plurality of CPS structures 141 are disposed between adjacent connection pads included in the plurality of connection pads 143 to mitigate crosstalk.

It is appreciated that the second semiconductor substrate 151 and the third semiconductor substrate 191 may be similarly coupled together at bonding interface 170 included in insulating medium 160. It is further appreciated that insulating medium 160 may include the same or similar components (e.g., metal wires or lines, contacts, intra- or inter-dielectrics, connection pads, connection vias, CPS structures, and the like) as insulating medium 130 to provide the same or similar features and/or advantages. In some embodiments, the insulating medium 160 may further include a plurality of CPS structures (not illustrated) similar to the plurality of CPS structures 141. However, in other embodiments, the plurality of CPS structures of the insulating medium 160 may be omitted.

As illustrated in FIG. 1B, the imaging system 100 further includes a plurality of photodiodes 104 (e.g., photodiode 104-1, photodiode 104-2, and so on until a Nth photodiode 104-N, where "N" corresponds to the total number of photodiodes included in the plurality of photodiodes 104) disposed between a first side 102 (e.g., a front side or a backside) and a second side 103 (e.g., a backside or a front side) opposite the first side 102 of the first semiconductor substrate 101, a plurality of color filters 111 (e.g., color filter 111-1, color filter 111-2, and so on until a Yth color filter 111-Y, where "Y" corresponds to the total number of color filters included in the plurality of color filters 111), and a plurality of microlenses 108 (e.g., microlens 108-1, microlens 108-2, and so on until an Xth microlens 108-X included in the plurality of microlenses 108) to collectively form a plurality of pixels 110 (e.g., a first pixel 110-1, a second pixel 110-2, and so until an Nth pixel 110-N, wherein "N" corresponds to the total number of pixels included in the plurality of pixels 110). As discussed previously the plurality of pixels 110 are segmented to form pixel cells included in the plurality of pixel cells 105 (e.g., pixel cell 105-1 as illustrated, which may be representative of any other pixel cell included in the plurality of pixel cells 105). It is appreciated that in some embodiments, the total number of photodiodes included in the plurality of photodiodes 104 (e.g., "N") may be equal to the total number of color filters (e.g., "Y") included in the plurality of color filters 111 and/or the total number of microlenses (e.g., "X") included in the plurality of microlenses 108 (e.g., a one-to-one ratio of photodiodes to color filters and/or a one-to-one ratio of photodiodes to microlenses). However, in other embodiments "X", "Y", and "N" may be different. In one embodiment, the plurality of color filters 111 may be shared by adjacent photodiodes included in the plurality of photodiodes 104 such that "Y" is less than "N." In the same or another embodiment, each pixel cell included in the plurality of pixel cells 105 may include multiple pixels included in the plurality of pixels 110. In some embodiments, pixels included in the plurality of pixels 110 for a common pixel cell included in the plurality of pixel cells 105 (e.g., pixel 110-1 and pixel 110-2 are included in pixel cell 105-1) may share the same color filter or otherwise have a common color filter configuration (e.g., color filter 111-1 and color filter 111-2 may have a common spectral photoresponse). In some embodiments, the plurality of pixel cells 105 may comprise 2×2 arrays of pixels included in the plurality of pixels 110.

The plurality of color filters 111 are optically disposed between the plurality of microlenses 108 and the plurality of photodiodes 104 such that light 199 propagates through both the plurality of microlenses 108 and the plurality of color filters 111 before reaching the plurality of photodiodes 104 (e.g., when the imaging system 100 is a backside illuminated image sensor). Each microlens included in the plurality of microlenses 108 is configured to direct or otherwise focus the light 199 through an underlying color filter included in the plurality of color filters 111 towards a respective one of the plurality of photodiodes 104. The plurality of color filters 111 filter or otherwise attenuate the light 199 focused by the plurality of microlenses 108. In some embodiments, the plurality of color filters 111 may include one or more red, green, blue, infrared, clear, transparent, cyan, magenta, yellow, black, or any other color filter to filter visible or non-visible light (e.g., the light 199). Similar to the plurality of color filters 111, the total number of microlenses (e.g., "X") included in the plurality of microlenses 108 may be equal to the total number of photodiodes (e.g., "N") included in the plurality of photodiodes 104 (e.g., a one-to-one ratio of microlenses to photodiodes) and/or the total number of color filters (e.g., "Y") included in the plurality of color filters 111 (e.g., a one-to-one ratio of microlenses to color filters). However, in other embodiments the plurality of microlenses 108 may be shared by adjacent photodiodes included in the plurality of photodiodes 104 (e.g., a group of adjacent photodiodes included in the plurality of photodiodes 104, such as the photodiode 104-1, photodiode 104-2, and/or other photodiodes adjacent to photodiode 104-1 and/or photodiode 104-2, may be optically aligned with or otherwise share an individual microlens included in the plurality of microlenses 108).

As illustrated in FIG. 1B, circuitry 154 is disposed in or on the second semiconductor substrate 151 and circuitry 194 is disposed in or on the optional third semiconductor substrate 191. In some embodiments, the circuitry 154 includes the pixel cell circuitry 155 and the periphery circuitry 156 illustrated in FIG. 1A (e.g., pixel transistors such as reset transistors, source-follower transistors, row select transistors, and so on, analog to digital circuitry, signal processing circuitry, and other circuitry to facilitate imaging an external scene). In some embodiments, the circuitry 154 (e.g., the plurality of pixel cell circuitry 155) is coupled to the plurality of pixel cells 105 via the plurality of connection pads 143. In the same or other embodiments, certain circuitry elements may be offloaded to the optional third semiconductor substrate 191, which includes the circuitry 194. In some embodiments, the circuitry 194 may include analog to digital circuitry, signal processing circuitry, and other circuitry to facilitate imaging, signal processing, or otherwise facilitate operation of the imaging system 100. It is appreciated that in some embodiments, certain circuitry elements may also be present in or on the first semiconductor substrate 101 that are not illustrated in FIG. 1A (e.g., one or more transfer gates, floating diffusion regions, and the like as illustrated in FIG. 1C and/or FIGS. 3A-3E).

In the illustrated embodiment, components included in or otherwise associated with the plurality of pixels 110 and/or the plurality of pixel cells 105 of the first semiconductor substrate 101 are electrically coupled to components disposed in or on the second semiconductor substrate 151 via the plurality of connection pads 143 on a per-pixel or per-pixel cell basis. In other words, in some embodiments there may be a one-to-one correspondence between the number of pixels included in the plurality of pixels 110 and/or the number of pixel cells included in the plurality of pixel cells 105 and the number of the plurality of connection pads 143. In addition to benefiting from readout or performance advantages associated with the higher quantity of interconnections, an added benefit is that adhesion strength between the first semiconductor substrate 101 and the second semiconductor substrate 151 is improved as the number of interconnections attributed to the plurality of connection pads 143 increases. Similarly, the plurality of CPS structures 141 further provides additional adhesion between the first semiconductor substrate 101 and the second semiconductor substrate 151 while also mitigating crosstalk between adjacent pairs of the plurality of connection pads 143.

Figure 1C:
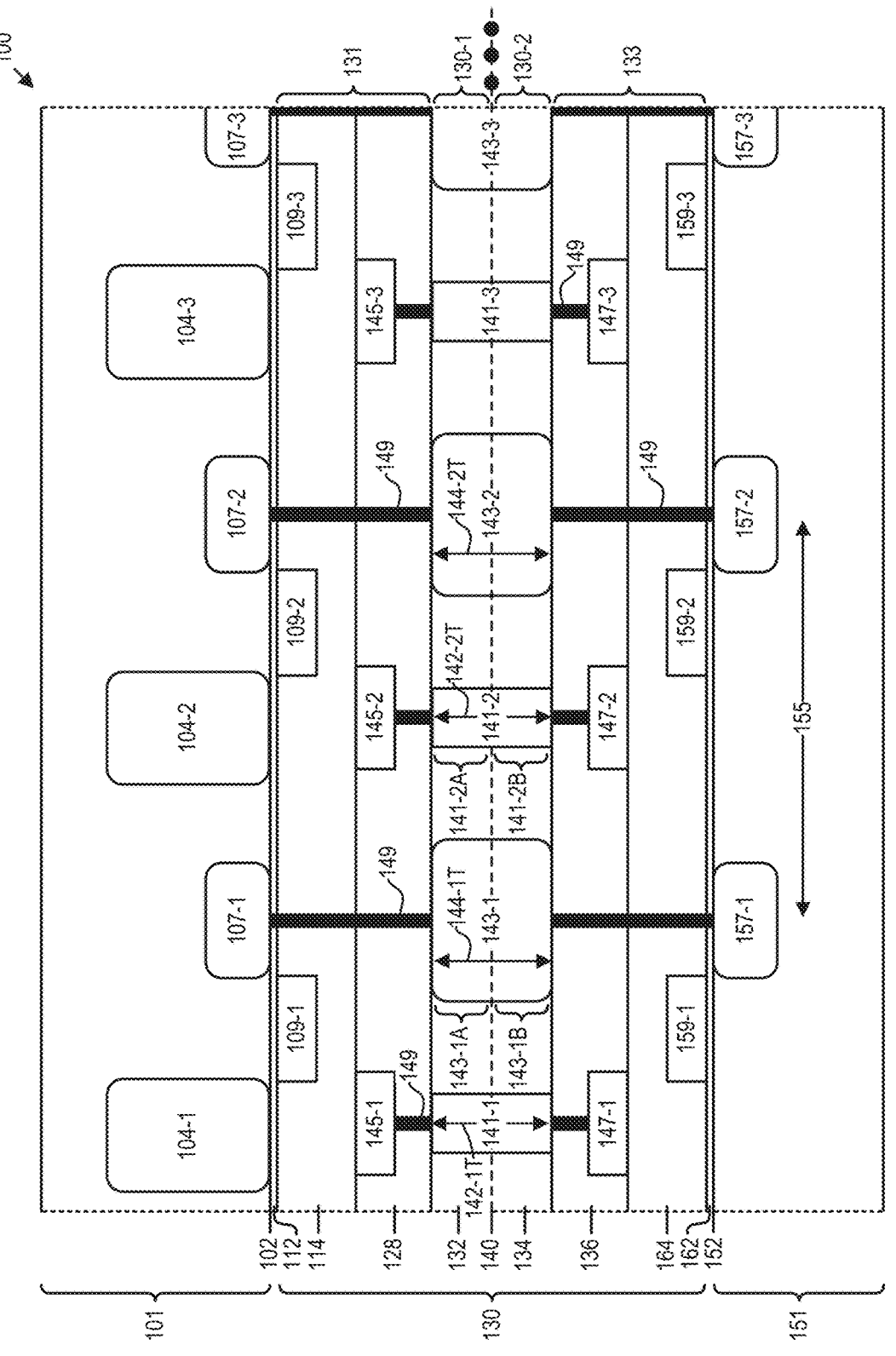
FIG. 1C illustrates a cross-sectional view of the imaging system with additional detail provided for the insulating medium including the plurality of CPS structures and the plurality of connection pads, in accordance with embodiments of the present disclosure.

FIG. 1C illustrates a cross-sectional view of the imaging system 100 with additional detail provided for the insulating medium 130 including the plurality of CPS structures 141 and the plurality of connection pads 143, in accordance with embodiments of the present disclosure. It is appreciated that certain elements may be omitted (e.g., the plurality of color filters 111, the plurality of microlenses 108, isolation structures, contacts to gate electrodes, source and drain regions of transistors, insulating medium 160, the third semiconductor substrate 191, and so on) to avoid obscuring certain aspects of the disclosure. As illustrated, insulating medium 130 includes first insulating layer 130-1, second insulating layer 130-2, one or more additional insulating layers 131, and one or more additional insulating layers 133, each of which may include one or more dielectric or insulating materials (e.g., dielectric materials 114, 128, 132, 134, 136, and 164) such as silicon dioxide, organosilicate glass such as SiCOH, porous SiCOH, other insulating materials, or combinations thereof that collectively form an insulating matrix. Disposed within the insulating matrix are one or more metallization layers, lines, wires, and/or vias that provide, inter alia, one or more interconnections spanning between the first semiconductor substrate 101 and the second semiconductor substrate 151. In the illustrated embodiment, the one or more metallization layers or wires include a plurality of contacts or interconnects 145 (e.g., 145-1, 145-2, 145-3) and 147 (e.g., 147-1, 147-2, 147-3) formed of a conductive material such as Au, Al, Cu, W, one or more alloys such as an aluminum alloy, other conductive materials, or combinations thereof. It is appreciated that the term "contact" or "interconnect" may be used interchangeably throughout the disclosure. Further disposed within the insulating medium 130 are the plurality of CPS structures 141 (e.g., 141-1, 141-2, and 141-3), the plurality of connection pads 143 (e.g., 143-1, 143-2, and 143-3), the plurality of connection vias 149, a plurality of first gate electrodes 109 (e.g., 109-1, 109-2, and 109-3), and a plurality of second gate electrodes 159 (e.g., 159-1, 159-2, and 159-3). The plurality of first gate electrodes 109 and the plurality of second gate electrodes 159 may be formed of a metal material (e.g., Au, Ag, Al, Cu, Ta, Nb), polycrystalline silicon, a silicide material, metal composites (e.g., WN, TiN, TaN), conductive metal oxides, other conductive materials with the appropriate conductivity and work function, or combinations thereof.

In the illustrated embodiment, the first insulating layer 130-1 is coupled to the first semiconductor substrate 101 while the second insulating layer 130-2 is coupled to the second semiconductor substrate 151 to respectively form first and second dies that are subsequently brought into contact (e.g., the first insulating layer 130-1 is brought in to contact and alignment with the second insulating layer 130-2 to bond the first semiconductor substrate 101 to the second semiconductor substrate 151 at the bonding interface 140). Specifically, an initially exposed surface of the first insulating layer 130-1 is aligned and mated with an initially exposed surface of the second insulating layer 130-2 to form the bonding interface 140, which is fixed in place via one or more hybrid bonding or direct bond interconnect processes (e.g., one or more thermal treatment steps). It is also appreciated that in some embodiments, preparation of the exposed surfaces of the first insulating layer 130-1 and the second insulating layer 130-2 before the first insulating layer 130-1 is placed in physical contact with the second insulating layer 130-2 may occur (e.g., oxygen plasma treatment to activate surface groups on the exposed surfaces of the first insulating layer 130-1 and the second insulating layer 130-2).

As illustrated in FIG. 1C, the first insulating layer 130-1 and the second insulating layer 130-2 are included in the insulating medium 130, which is disposed between the first semiconductor substrate 101 and the second semiconductor substrate 151. The one or more additional insulating layers 131 are disposed between the first insulating layer 130-1 and the first semiconductor substrate 101. Similarly, one or more additional insulating layers 133 are disposed between the second insulating layer 130-2 and the second semiconductor substrate 151. It is appreciated that the first semiconductor substrate 101, dielectric layer 112, one or more additional insulating layers 131, and first insulating layer 130-1 may form a first wafer or die that may be bonded to a second wafer or die. The second die includes the second insulating layer 130-2, one or more additional insulating layers 133, dielectric 162, and second semiconductor substrate 151. The first die and the second die, as illustrated, are coupled to one another at bonding interface 140, which corresponds to where the first insulating layer 130-1 interfaces with the second insulating layer 130-2.

The plurality of connection pads 143 are disposed within the insulating medium 130 and are configured to provide pathways for one or more electrical components of the first semiconductor substrate 101 to interconnect with one or more electrical components of the second semiconductor substrate 151 (e.g., one or more electrical connections extending between the first semiconductor substrate 101 and the second semiconductor substrate 151). For example, the plurality of connection pads 143 are coupled to one or more electrical components (e.g., first floating diffusion regions 107 including any of floating diffusion regions 107-1, 107-2, and 107-3 disposed in the first semiconductor substrate 101) and one or more electrical components (e.g., second floating diffusion regions 157 including any of floating diffusion regions 157-1, 157-2, and 157-3 disposed in the second semiconductor substrate 151) via respective connection vias 149 extending through the one or more additional insulating layers 131 and 133 until reaching an appropriate contact pad associated with or otherwise corresponding to the one or more electrical components of the first semiconductor substrate 101 or the second semiconductor substrate 151. It is appreciated that in some embodiments, individual connection pads included in the plurality of connection pads 143 may be aligned or otherwise disposed between respective components included in the one or more electrical components of the first semiconductor substrate 101 and the second semiconductor substrate 151 such that one or more corresponding vias included in the connection vias 149 may have a substantially direct route (e.g., the connection vias 149 may have a straight shot to the respective components instead of deviating laterally through the one or more additional insulating layers 131 and 133). For example, in the illustrated embodiment, connection pad 143-1 (e.g., a first connection pad) is disposed between floating diffusion region 107-1 (e.g., a first floating diffusion region) and floating diffusion region 157-1 (e.g., a second floating diffusion region) such that the appropriate vias included in the connection vias 149 extend vertically without substantial lateral deviation (e.g., the appropriate vias included in the connection vias 149 each do not laterally extend beyond the lateral bounds defined by the connection pad 143-1, the floating diffusion region 107-1, and the floating diffusion region 157-1 such that the appropriate vias are completely disposed between the floating diffusion regions 107-1 or 157-1 and the connection pad 143-1). It is appreciated that the first floating diffusion regions 107 and the second floating diffusion regions 157 may correspond to active regions of the respective semiconductor substrates (e.g., first semiconductor substrate 101 and second semiconductor substrate 151) that have been doped (e.g., n-type implant region or p-type implant regions) sufficiently to at least temporarily store image charge photogenerated by coupled photodiodes included in the plurality of photodiodes 104. For example, in response to a transfer signal applied to first gate electrode 109-1, image charge photogenerated by photodiode 104-1 (e.g., in response to incident light) may be transferred to floating diffusion region 107-1.

It is appreciated that the one or more electrical components of the first semiconductor substrate 101 and the second semiconductor substrate 151 may correspond to or otherwise include different components such as transistors, capacitors, electrodes, memory elements, and the like. In the illustrated embodiment, the first floating diffusion regions 107 and the second floating diffusion regions 157 may be included as a component (e.g., source/drain) of one or more transistors. For example, one of the plurality of first gate electrodes 109 (e.g., 109-1, 109-2, 109-3, and so on) of the first semiconductor substrate 101 correspond to transfer gates that respectively couple one of the first floating diffusion regions 107 to one of the plurality of photodiodes 104 to transfer image charge from the plurality of photodiodes 104 to corresponding floating diffusion regions included in the plurality of the first floating diffusion regions 107. As illustrated, dielectric layer 112 (e.g., silicon dioxide, hafnium dioxide, zirconium dioxide, silicon oxynitrides, metal silicates, other insulating materials, or combinations thereof) is disposed on or otherwise proximate to the first side 102 of the first semiconductor substrate 101 to form a gate dielectric. In one example, gate electrode 109-1 is coupled to photodiode 104-1 and floating diffusion region 107-1 to form a transfer transistor and facilitate readout of the photodiode 104-1. Accordingly, in some embodiments, the first gate electrodes 109 may alternatively be referred to as transfer gates. Of course, it is appreciated that in the illustrated embodiments, the majority of readout circuitry for the imaging system 100 may be distributed in or on the second semiconductor substrate 151. Accordingly, image charge may be transferred from the first floating diffusion regions 107 in or on the first semiconductor substrate 101 to the second floating diffusion regions 157 in or on the second semiconductor substrate 151 via the plurality of connection pads 143. Readout may then in response, inter alia, an appropriate signal applied to the plurality of second gate electrodes 159 (e.g., 159-1, 159-2, 159-3, and so on), which form transistors with the second floating diffusion regions 157 (e.g., 157-1, 157-2, 157-3, and so on, respectively). In some embodiments, transistors with the second floating diffusion regions 157 (e.g., 157-1, 157-2, 157-3, and so on, respectively) may be reset transistors for the pixel or pixel cells and second floating diffusion regions 157 may be coupled as drain regions of the reset transistors. The first floating diffusion regions 107, the second floating diffusion regions 157, and/or the photodiodes 104 may then be reset or precharged in response to, inter alia, an appropriate signal applied to the plurality of second gate electrodes 159 (e.g., 159-1, 159-2, 159-3, and so on). In some embodiments, transistors with the second floating diffusion regions 157 (e.g., 157-1, 157-2, 157-3, and so on, respectively) may be dual floating diffusion transistors and the second floating diffusion regions 157 may be coupled as drain regions of the dual floating diffusion transistors. Readout with various conversion gains may then occur in response to, inter alia, an appropriate signal applied to the plurality of second gate electrodes 159 (e.g., 159-1, 159-2, 159-3, and so on) to realize high dynamic range imaging. As illustrated, a dielectric layer 162 (e.g., silicon dioxide, hafnium dioxide, zirconium dioxide, silicon oxynitrides, metal silicates, other insulating materials, or combinations thereof) is disposed on or otherwise proximate to a first side 152 of the second semiconductor substrate 151 to form a gate dielectric. Additional circuitry for readout may further be disposed in or on the second semiconductor substrate (e.g., source-follower gates, reset gates, row select gates, and so on such as the example embodiment illustrated in FIG. 3A).

Referring back to FIG. 1C, it was found that crosstalk may occur during readout between adjacent connection pads included in the plurality of connection pads 143, which may detrimentally affect signal quality. In some embodiments, the plurality of connection pads 143 may be arranged as an array in which the plurality of connection pads 143 are regularly spaced apart (e.g., similar to the arrangement of the plurality of photodiodes 104). However, as pixel density increases and/or pixel or pixel cell area size decreases, crosstalk between adjacent components may occur. For example, it was found that by utilizing a multi-stack structure for the imaging system 100, pixel pitch could be reduced to approximately (e.g., within 10%) 0.6 μm, 0.5 μm, 0.4 μm, or lower to increase photodiode fill factor by offloading components to secondary or tertiary substrates such as the second semiconductor substrate 151. However, as pixel pitch decreases, separation distance between components also decreases. For example, a distance 155 between midpoints of the first floating diffusion regions 107 and/or the second floating diffusion regions 157 may be similarly representative of the pixel pitch (e.g., approximately 0.6 μm, 0.5 μm, 0.4 μm, or lower). In some embodiments, distance 155 is similarly representative of a distance between midpoints of adjacent connection pads (e.g., connection pads 143-1 and 143-2) included in the plurality of connection pads 143. In the same or other embodiments, distance 155 is similarly representative of a distance between midpoints of adjacent CPS structures (e.g., CPS structures 141-1 and 141-2) included in the plurality of CPS structures 141. In some cases, it was found that this crosstalk between adjacent components (e.g., crosstalk coupling percentage) may be greater than 5%, which is significantly higher than a target coupling percentage of crosstalk, which may be less than or equal to 1% (e.g., from 0.5% to 1%). In other embodiments, lower or higher crosstalk coupling percentages may be targeted. For example, crosstalk may occur between connection pads 143-1 and 143-2 (e.g., a first connection pad laterally adjacent to a second connection pad). It is appreciated that the term adjacent, when referring to the plurality of connection pads 143, indicates there are no other connection pads disposed between (e.g., there are no intervening connection pads included in the plurality of connection pads 143 disposed between the first connection pad 143-1 and the second connection pad 143-2).

To mitigate crosstalk between adjacent ones of the plurality of connection pads 143 (e.g., a first adjacent set including connection pad 143-1 and 143-2), embodiments of the disclosure include the plurality of connection pad shield (CPS) structures 141 (e.g., 141-1, 141-2, and 141-3) disposed within the insulating medium 130 and laterally adjacent to the plurality of connection pads 143. The plurality of CPS structures 141 is arranged such that individual CPS structures are laterally disposed within the insulating medium 130 between two or more adjacent connection pads included in the plurality of connection pads 143. In the illustrated embodiment, CPS structure 141-2 is disposed between connection pads 143-1 and 143-2 (e.g., a first CPS structure is disposed within the insulating medium between at least the first connection pad and the second connection pad). Similarly, connection pad 143-1 is disposed between CPS structures 141-1 and 141-2. (e.g., the first connection pad is disposed between the first CPS structure and the second CPS structure). It is appreciated that the plurality of CPS structures 141 may include a conductive material (e.g., Au, Al, Cu, W, one or more alloys such as an aluminum alloy, other conductive materials that are capable of forming a covalent and/or metallic bond at the bonding interface 140, or combinations thereof) and further that the plurality of CPS structures 141 is configured (e.g., to have a specific geometry, width, thickness, or the like) to mitigate crosstalk between adjacent connection pads (e.g., any adjacent set of the plurality of connection pads 140). For example, CPS structure 141-2 is positioned to mitigate crosstalk between connection pads 143-1 and 143-2. Similarly, CPS structure 141-1 is positioned proximate to connection pad 143-1 to provide similar crosstalk mitigation from adjacent connection pads included in the plurality of connection pads 143. Accordingly, connection pad 143-1 is positioned between CPS structure 141-1 and 141-2. In some embodiments, each of the connection pads included in the plurality of connection pads 143 may be laterally surrounded (see, e.g., FIG. 4A-4I) by two or more connection pads to collectively mitigate crosstalk.

In the illustrated embodiment of FIG. 1C, the plurality of CPS structures 141 and the plurality of connection pads 143 include respective portions (e.g., first portions associated with the first semiconductor substrate 101 and second portions associated with the second semiconductor substrate 151) that may be bonded or otherwise coupled together when the first semiconductor substrate 101 is brought into contact and alignment with the second semiconductor substrate 151. For example, connection pad 143-1 includes first portion 143-1A, which was formed on the first semiconductor substrate 101, and second portion 143-1B, which was formed on the second semiconductor substrate 151. Similarly, CPS structure 141-2 includes first portion 141-2A, which was formed on the first semiconductor substrate 101, and second portion 141-2B, which was formed on the second semiconductor substrate 151. It is appreciated that not all of the respective portions of the plurality of CPS structures 141 and the plurality of connection pads 143 are explicitly labeled to avoid obscuring the figures. However, one will understand that the bonding interface 140 is a defining interface indicating which components, structures, or other physical features are associated with a corresponding semiconductor substrate. For example, any element disposed between the bonding interface 140 and the first side 102 of the first semiconductor substrate 101 is associated with and/or formed in or on the first semiconductor substrate 101. Similarly, any element disposed between the bonding interface 140 and the first side 152 of the second semiconductor substrate 151 is associated with and/or formed in or on the second semiconductor substrate 151. Thus, depending on the configuration, CPS structures included in the plurality of CPS structures 141, may have portions associated with both the first semiconductor substrate 101 and the second semiconductor substrate 151 (as illustrated in FIG. 1C) or may individually be only associated with the first semiconductor substrate 101 or the second semiconductor substrate 151 (as illustrated in FIGS. 2A-2D). Advantageously, it was found that having CPS structures included in the plurality of CPS structures 141 having a thickness 141T (e.g., thickness 141-1T of CPS structure 141-1, thickness 141-2T of CPS structure 141-2, and so on) substantially equal (e.g., within 10% or otherwise based on the variance attributed to the fabrication process) to a corresponding thickness of connection pads included in the plurality of connection pads 143 (e.g., thickness 153-1 of connection pad 143-1, thickness 153-2 of connection pad 143-2, and so on) results in improved crosstalk mitigation at the cost of increased manufacturing cost and variance (e.g., due to the potential offset when aligning respective portions of the plurality of CPS structures 141 and the plurality of connection pads 143).

In the illustrated embodiment, thickness 144-1T of connection pad 143-1 and thickness 144-2T of connection pad 143-2 are each substantially equal (e.g., within 10% or otherwise based on the variance attributed to the fabrication process) to thickness 142-1T of CPS structure 141-1 and thickness 142-2T of CPS structure 141-2. It is appreciated that the corresponding thickness (e.g., 144-1T, 144-2T, 142-1T, 142-2T, and so on) is based on the collective thickness of the respective portions that form individual connection pads included in the plurality of connection pads 143 and/or individual CPS structures included in the plurality of CPS structures 141. For example, CPS structure 141-2 includes first portion 141-2A and second portion 141-2B, each disposed between connection pad 143-1 and connection pad 143-2 and further extending from bonding interface 140. As discussed previously, bonding interface 140 corresponds to where first insulating layer 130-1 interfaces with second insulating layer 130-2, which are respectively coupled to the first semiconductor substrate 101 and the second semiconductor substrate 151.

As illustrated in FIG. 1C, the plurality of CPS structures 141 may be individually coupled to the same or different power terminals (e.g., via a plurality of contacts or interconnects 145 and 147 coupled to the plurality of CPS structures 141 via connection vias 149) to receive the same or different pre-determined biases (e.g., supply voltage $V_{DD}$ from a power supply, ground, or a different bias voltage or potential to mitigate electrical interference). It is appreciated that the plurality of contacts or interconnects 145 and/or 147 may be coupled to or otherwise correspond to metal wires formed during back end of line processing of the first semiconductor substrate 101 and/or second semiconductor substrate 151. As illustrated, respective portions (e.g., 141-2A, 141-2B, or other portions not explicitly labeled) of the plurality of CPS structures 141 may be individually coupled to one or more of the plurality of contacts or interconnects 145 and/or 147. For example, at least one of first portion 141-2A or second portion 141-2B of CPS structure 141-2 is coupled to a power terminal of the imaging system 100 via contacts or interconnects 145-2 and 147-2, respectively, to receive a pre-determined bias. Similarly, respective portions of CPS structure 141-1 are coupled to contacts or interconnects 145-1 and 147-1 to receive the pre-determined bias while respective portions of CPS structure 141-3 are coupled to contacts or interconnects 145-3 and 147-3 to receive the pre-determined bias. It is appreciated that in some embodiments, the pre-determined biases provided to the at least one of first portion 141-2A or second portion 141-2B of CPS structure 141-2 through corresponding contacts or interconnects 145-2 and 147-2 may be from different power terminal or power sources that are located in different locations (e.g., from different power planes on different substrates). For example, first portion 141-2A may be coupled to a first power terminal to receive a first pre-determined bias while second portion 141-2B may be coupled to a second power terminal different from the first terminal to receive a second pre-determined bias which may be the same as the first pre-determined bias. In most embodiments, the plurality of CPS structures 141 of the imaging system 100 may be uniformly biased or commonly biased to provide uniform crosstalk mitigation. It is further appreciated that by coupling both respective portions of a given one of the plurality of CPS structures 141 (e.g., 141-2A and 141-2B of CPS structure 141-2), the pre-determined bias may be applied to the plurality of CPS structures 141 regardless of whether the respective portions are offset from one another (e.g., due to misalignment between the first semiconductor substrate 101 and the second semiconductor substrate 151).

FIGS. 2A-2D illustrate configurations of a plurality of CPS structures 241, a plurality of connection pads 243, and a plurality of connection vias 249 within an insulating medium 230, in accordance with embodiments of the present disclosure. Each of these configurations are possible implementations of the plurality of CPS structures 141 and plurality of connection pads 143 of FIG. 1C or may otherwise be implemented in the imaging system 100 illustrated in FIGS. 1A-1C. Accordingly, similarly labeled elements (e.g., plurality of CPS structures 241 corresponding to plurality of CPS structures 141, plurality of connection pads 243 corresponding to plurality of connection pads 143, plurality of connection vias 249 corresponding to plurality of connection vias 149, and so on) may include similar features, such as composition, shape, structure, arrangement, distribution, combinations thereof, and so on, in accordance with embodiments of the disclosure. Additionally, it is appreciated that elements of FIGS. 2A-2D may share similar features (e.g., composition, shape, structure, arrangement, distribution, combinations thereof, and so on), but for aspects that are explicitly pointed out as being different. For example, geometric relationships (e.g., relative widths, thickness, area, and so on) may be similar between FIGS. 2A-2D, in accordance with embodiments of the disclosure.

Referring back to FIGS. 2A-2D, the illustrated configurations include first semiconductor substrate 201, second semiconductor substrate 251, insulating medium 230 disposed between dielectric layers 212 and 262, plurality of CPS structures 241, plurality of connection pads 243, plurality of connection vias 249, and plurality of contacts 254. The insulating medium 230 includes first insulating layer 230-1 and second insulating layer 230-2, which are coupled together at bonding interface 240. The insulating medium further includes one or more additional insulating layers 231 and one or more additional insulating layers 233. It is appreciated that elements may be suffixed with an "A" or a "B" in FIGS. 2A-2D to indicate that the given element is associated with (i.e., coupled to a corresponding substrate included in substrates of a stacked chip device before the substrates are bonded or otherwise adhered together) a first semiconductor substrate (e.g., the first semiconductor substrate 101 illustrated in FIGS. 1A-1C) or a second semiconductor substrate (e.g., the second semiconductor substrate 151 illustrated in FIGS. 1A-1C), respectively. It is noted that bonding interface 240 corresponds to where the first semiconductor substrate and the second semiconductor substrate are bonded or otherwise adhered. Accordingly, the suffix of a given element describes the relative position of said element between the bonding interface 240 and the first semiconductor substrate 201 or the second semiconductor substrate 251. For example, any element with an "A" suffix is disposed between the bonding interface 240 and the first semiconductor substrate 201. Composite elements (e.g., elements formed of portions associated with both the first semiconductor substrate 201 and the second semiconductor substrate 251) may be generally referred to without a corresponding suffix (e.g., connection pad 243-1 includes first portion 243-1A and second portion 243-1). Additionally, it is noted that not all elements may be illustrated or labeled within FIGS. 2A-2D. For example, each of the plurality of CPS structures 241 may be coupled to one or more contacts (e.g., plurality of contacts or interconnects 145 and 147 illustrated in FIG. 1C) to individually receive a pre-determined bias from a power terminal via the plurality of connection vias 249.

Figures 2A, 2B:
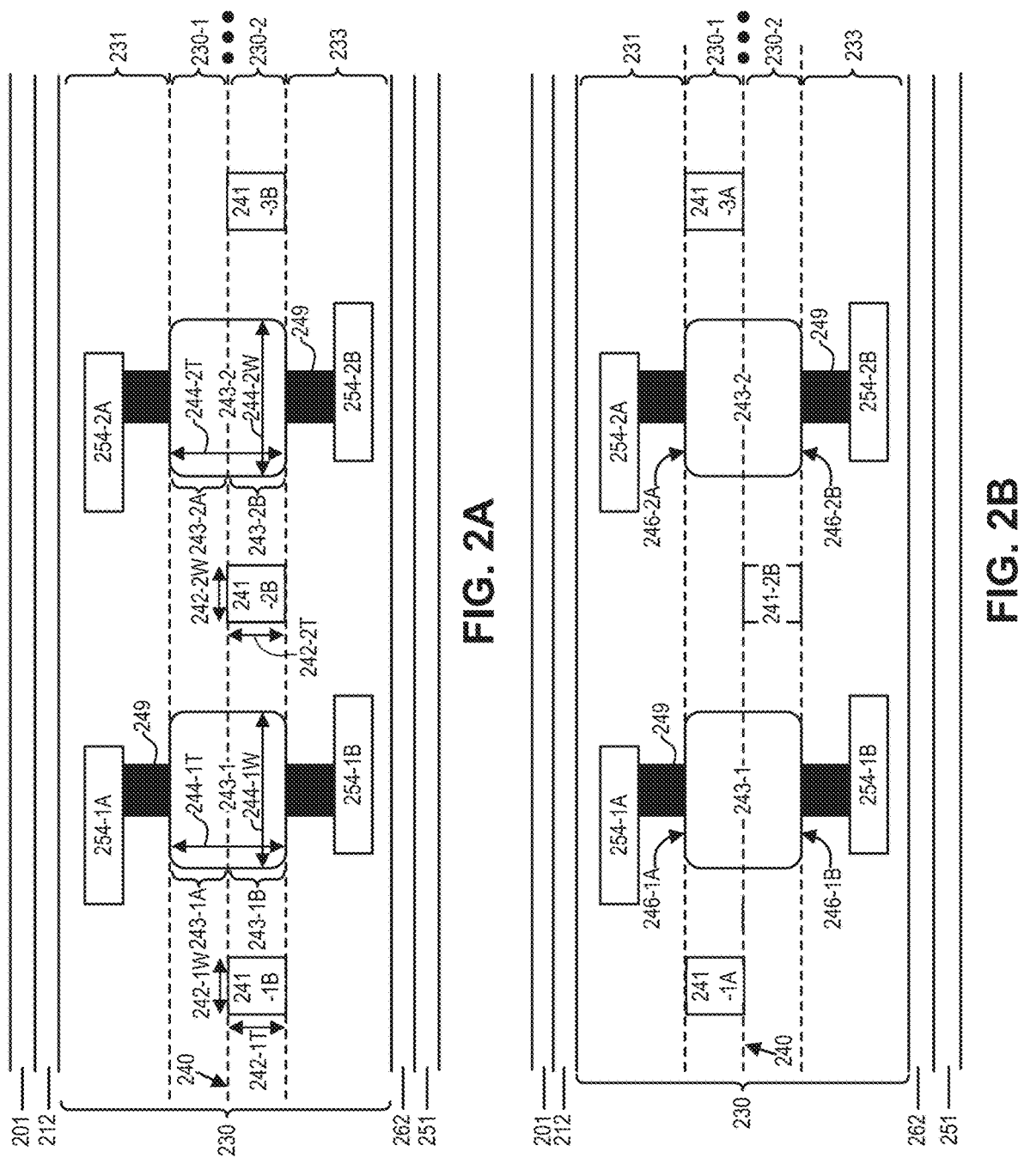
FIGS. 2A-2D illustrate configurations of a plurality of CPS structures, a plurality of connection pads, and a plurality of connection vias within an insulating medium, in accordance with embodiments of the present disclosure.

FIG. 2A illustrates a configuration of the plurality of CPS structures 241 disposed exclusively within the second insulating layer 230-2 (or alternatively exclusively within the first insulating layer 230-1) of the insulating medium 230, in accordance with embodiments of the disclosure. It is noted that by limiting the plurality of CPS structures 241 to the second insulating layer 230-2 (or the first insulating layer 230-1), processing is simplified and alignment of the first semiconductor wafer 201 and the second semiconductor wafer 251 is more forgiving as the larger area plurality of connection pads 243 can be aligned more readily than the smaller area plurality of CPS structures 241. This is because the widths of individual CPS structures included in the plurality of CPS 241 (e.g., widths 242-1W, 242-2W, and so on) is less than the widths of individual connection pads included in the plurality of connection pads 243 (e.g., widths 244-1W, 242-2W, and so on). For example, width 241-1W of CPS structure 241-1B and width 241-2W of CPS structure 241-2B are each less than respective widths 244-1W of connection pad 243-1 and 244-2W of connection pad 243-2.

Another advantageous effect of limiting the plurality of CPS structures 241 to be within the second insulating layer 230-2 or the first insulating layer 230-1 is that adhesion between the first semiconductor substrate 201 and the second semiconductor substrate 251 may be enhanced as the plurality of CPS structures 241 may form hybrid bonds with the contacting insulating layer (e.g., first insulating layer 230-1 or second insulating layer 230-2). For example, hydroxyl groups formed on the contacting insulating layer may form a metal oxide coupling the contacting insulating layer to the plurality of CPS structures 241 at the bonding interface 240 during the hybrid bonding process, which may increase adhesion between the first semiconductor substrate 201 and the second semiconductor substrate 251. Accordingly, in some embodiments, the plurality of CPS structures 241 extend from the bonding interface 240 towards the second semiconductor substrate 251 (or the first semiconductor substrate 201) such that the plurality of CPS structures 241 directly contact the first insulating layer 230-1 (or the second insulating layer 230-2) at the bonding interface 240. Direct contact may result in the formation of a thin metal oxide layer formed at the bonding interface 240. In such a configuration, the thickness of the plurality of connection pads 243, which extend through both the first insulating layer 230-1 and the second insulating layer 230-2, is greater than the thickness of the plurality of CPS structures 241. For example, thickness 244-1T of connection pad 243-1 and thickness 244-2T of connection pad 243-2 are each greater than both thickness 242-1T of CPS structure 241-1B and thickness 242-2T of CPS structure 241-2B.

FIG. 2B illustrates a configuration of the plurality of CPS structures 241 that laterally alternate from being disposed exclusively within the first insulating layer 230-1 and the second insulating layer 230-2, in accordance with embodiments of the disclosure. An advantageous effect of the alternating position of the plurality of CPS structures 241 is that it may be easier to couple each of the plurality of CPS structures 241 to a corresponding contact to receive a pre-determined bias from a power terminal (e.g., as illustrated in FIG. 1C) since there is more space (relative, for example, to FIG. 2A) to couple each of the plurality of CPS structures 241 individually. Additionally, crosstalk mitigation may be improved by the alternating implementation when applying the pre-determined bias to the plurality of CPS structures 241 compared to when the plurality of CPS structures 241 is disposed exclusively in only one of the first insulating layer 230-1 or the second insulating layer 230-2 at the cost of increased fabrication.

To achieve the alternating implementation, the plurality of CPS structures 241, individual CPS structures alternate from being disposed in the first insulating layer 230-1 while not being disposed in the second insulating layer 230-2 and being disposed in the second insulating layer 230-2 while not being disposed in the first insulating layer 230-1 when viewing a cross-section of the insulating medium 230. In the illustrated embodiment, CPS structure 241-1A and CPS structure 241-3A each extend from the bonding interface 240 towards the first semiconductor substrate 201 such that CPS structure 241-1A and CPS structure 241-3A each directly contact the second insulating layer 230-2 at the bonding interface 240. Disposed between CPS structure 241-1A and CPS structure 241-3A is CPS structure 241-2B, which extends from the bonding interface 240 towards the second semiconductor 251 such that CPS structure 241-2B directly contacts the first insulating layer 230-1 at the bonding interface 240.

In some embodiments, the plurality of CPS structures 241 may be exclusively disposed in the first insulating layer 230-1 or the second insulating layer 230-2 or otherwise be aligned with one or more of the plurality of connection pads 243. In one embodiment, at least one of the individual CPS structures included in the plurality of CPS structures 241 is aligned with at least one of the surfaces 246 of the plurality of connection pads 243-1, such as surfaces 246-1A, 246-1B, 246-2A, or 246-2B. In the illustrated embodiment of FIG. 2B, CPS structure 241-1A and CPS structure 241-3A are each aligned with surface 246-1A of connection pad 243-1 and surface 246-2A of connection pad 243-2 (e.g., CPS structures 241-1A and 241-3A both terminate at the same plane that connection pads 243-1 and 243-2 terminate within the first insulating layer 230-1). Similarly, CPS structure 241-2B is aligned with surface 246-1B of connection pad 243-1 and with surface 246-2B of connection pad 243-2 (e.g., CPS structure 241-2B terminates at the same plane that connection pads 243-1 and 243-2 terminate within the second insulating layer 230-2). In other words, in some embodiments, the plurality of CPS structures 241 may be coplanar with the plurality of connection pads 243. Consequently, in some embodiments, a thickness of each individual connection pad included in the plurality of connection pads 243 may be greater than a corresponding thickness of each CPS structure included in the plurality of CPS structures 241.

Figures 2C, 2D:
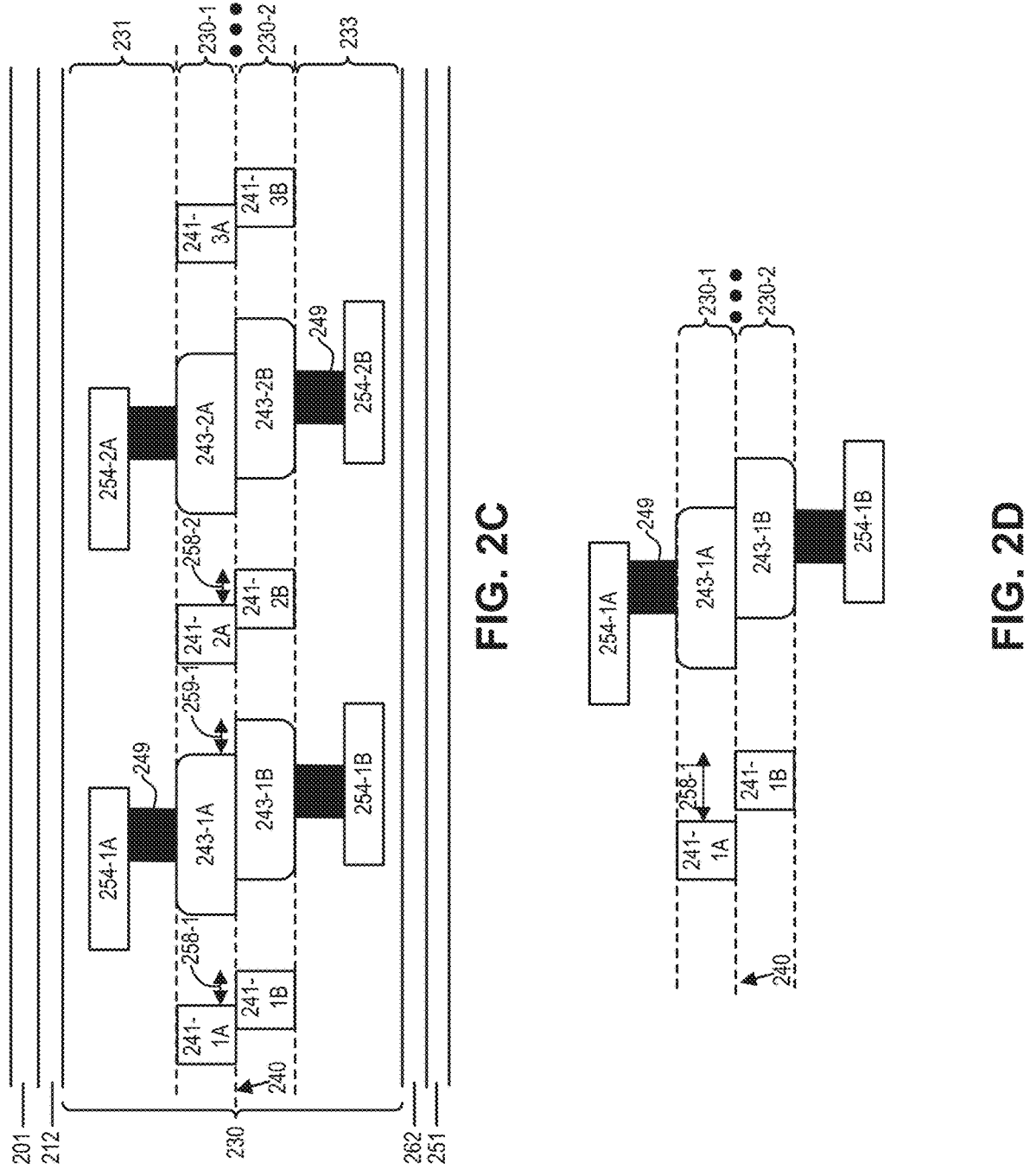

FIG. 2C illustrates a configuration where the plurality of CPS structures 241 and the plurality of connection pads 243 are offset, in accordance with embodiments of the disclosure. Respective portions of the plurality of CPS structures 241 and the plurality of connection pads 243 may become offset due, for example, to misalignment between the first semiconductor substrate 201 and the second semiconductor substrate 251. In the illustrated embodiment, a lateral edge of portion 241-1A of CPS structure 241-1 is offset with respect to a lateral edge of portion 241-1B of CPS structure 241-1 by offset distance 258-1 at the bonding interface 240. Similarly, a lateral edge of portion 241-2A of CPS structure 241-2 is offset with respect to a lateral edge of portion 241-2B of CPS structure 241-2 by offset distance 258-2 at the bonding interface 240. In some embodiments, the offset distances 258-1 and 258-2 are the same. However, in other embodiments, offset distances 258-1 and 258-2 may be different depending on process design and variation. It is appreciated that the plurality of connection pads 243 may also be offset. For example, in the illustrated embodiment, a lateral edge of portion 243-1A of connection pad 243-1 is offset with respect to a lateral edge of portion 243-1B of connection pad 243-1 by offset distance 259-1 at the bonding interface 240. It is appreciated that in some embodiments, the offset of the plurality of CPS structure 241 and the plurality of connection pads 243 may occur for other configurations. For example, the plurality of connection pads 243 illustrated in FIGS. 2A and 2B may be offset in some embodiments. In another embodiment, the plurality of CPS structures 141 and the plurality of connection pads 143 illustrated in FIGS. 1B and 1C may be offset.

FIG. 2D illustrates an embodiment where the degree of offset between the plurality of CPS structures 241 is of such an extent that the individual portions of a given CPS structure included in the plurality of CPS structures 241 do not directly contact one another, in accordance with an embodiment of the present disclosure. In the illustrated embodiment, portion 241-1A of CPS structure 241 does not directly contact portion 241-1B of CPS structure 241 due to the offset distance 258-1 being greater than a width of portion 241-1A and/or portion 241-1B. In some embodiments, both portions of a given one of the plurality of CPS structures may be coupled to receive a pre-determined bias from a power terminal (e.g., as illustrated in FIG. 1C) to compensate for the lack of connection between the portions. For example, portions 241-1A and 241-1B may each be individually coupled to a contact (e.g., via connection vias) to receive a pre-determined bias or potential from a power terminal (e.g., as illustrated in FIG. 1C), in accordance with embodiments of the present disclosure.

It is appreciated that embodiments illustrated in FIGS. 1C-2D show the first insulating layer 130-1 and 230-1 as being substantially equal in thickness to the second insulating layer 130-2 and 230-2. However, in other embodiments, the thickness of the first insulating layer 130-1 and 230-1 is not equal to the second insulating layer 130-2 and 230-2. In doing so, the corresponding portions of the plurality of CPS structures 141 and 241 and the plurality of connection pads 143 and 243 may be affected. Referring back to FIG. 1C, for example, portion 143-1A may be greater in thickness or depth than 143-1B of connection pad 143-1 (or vice versa) while portion 141-2A may be greater in thickness or depth than portion 141-2B (or vice versa). Having different thicknesses of the first insulating layers 130-1 and 230-1 relative to the second insulating layers 130-2 and 230-3-2 may be advantageous for embodiments where the plurality of CPS structures 141 and 241 are do not extend beyond the bonding interfaces 140 and 240 (e.g., embodiments illustrated in FIGS. 2A and 2B) since crosstalk mitigation may be improved. Referring to FIG. 2A, for example, a thickness of CPS structure 242-1B and CPS structure 241-2B may be greater than a thickness of portion 243-1A of connection pad 243-1 to improve crosstalk mitigate between connection pads 243-1 and 243-2.

Figure 3A:
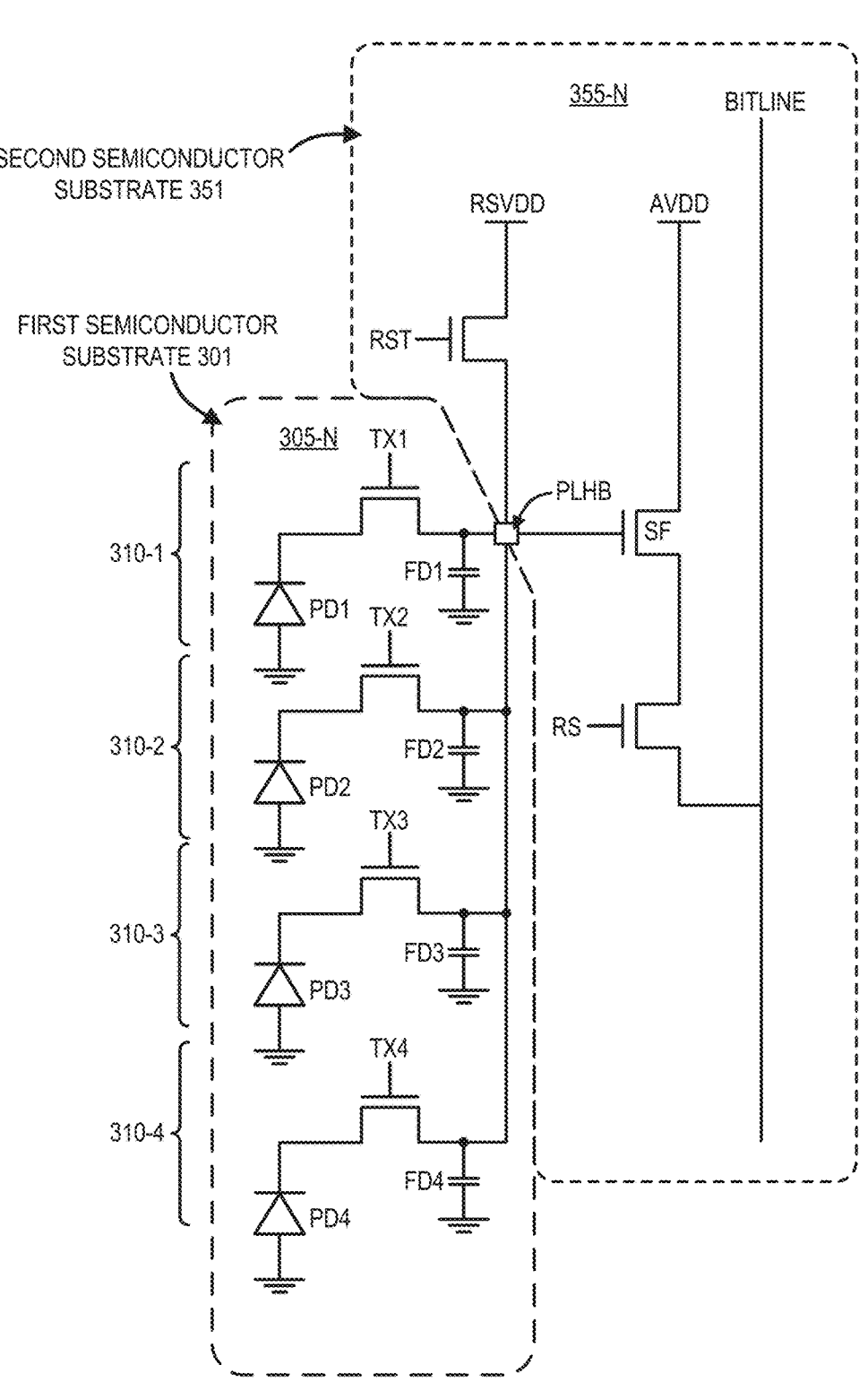
FIG. 3A illustrates a schematic diagram of a pixel cell and pixel cell circuitry included in an imaging system corresponding to a stacked semiconductor device with connection pad shield, in accordance with embodiments of the present disclosure.

FIG. 3A illustrates a schematic diagram 300 of a pixel cell 305-N (e.g., any pixel cell included in the plurality of pixel cells 105 illustrated in FIG. 1A) and pixel cell circuitry 355-N (e.g., a group of individual components included in the pixel cell circuitry 155 for a given one of the plurality of pixel cells 105 illustrated in FIG. 1A) included in an imaging system (e.g., imaging system 100 illustrated in FIGS. 1A-1C) corresponding to a stacked semiconductor device with connection pad, in accordance with embodiments of the present disclosure. In particular, the schematic diagram 300 is one possible circuitry configuration for the plurality of pixel cells 105 and the pixel cell circuitry 155 of the imaging system 100 illustrated in FIGS. 1A-1C. The schematic diagram 300 illustrates elements included in or on the first semiconductor substrate 301 (e.g., which may correspond to the first semiconductor substrate 101 illustrated in FIGS. 1A-1C and/or the first semiconductor substrate 201 illustrated in FIGS. 2A-2D), which includes a plurality of pixels 310 (e.g., pixel 310-1, pixel 310-2, pixel 310-3, and pixel 310-4) included in pixel cell 305-N. Each of the plurality of pixels 310 includes a photodiode (e.g., PD1, PD2, PD3, and PD4), a transfer gate (e.g., TX1, TX2, TX3, and TX4), and a floating diffusion region (e.g., FD1, FD2, FD3, and FD4) to collectively form the pixel cell 305-N. The pixel cell 305-N may be one possible implementation of any pixel cell included in the plurality of pixel cells 105 illustrated in FIGS. 1A-1B. In some embodiments, elements PD1, PD2, PD3, and PD4 may be one possible implementation of the plurality of photodiodes 104 illustrated in FIGS. 1B-1C. In the same or another embodiment, elements FD1, FD2, FD3, and FD4 may be one possible implementation of the first floating diffusion regions 107 illustrated in FIG. 1C. In the same or another embodiment, elements TX1, TX2, TX3, and TX4 may be one possible implementation of the plurality of first gate electrodes 109 illustrated in FIG. 1C.

In the embodiment illustrated by FIG. 3A, the pixel cell circuitry 355-N includes a reset transistor RST, a source-follower transistor SF, and a row select transistor RS. As illustrated by the schematic 300, each of the plurality of floating diffusion regions for the pixel cell 305-N (i.e., FD1, FD2, FD3, and FD4) are coupled together and subsequently coupled to the second semiconductor substrate 351 via a pixel-level hybrid bond (PLHB), which may correspond to a connection pad included in the plurality of connection pads 143 illustrated in FIGS. 1B-1C and/or the plurality of connection pads 243 illustrated in FIGS. 2A-2D. In some embodiments, the PLHB is achieved, at least in part, by forming a corresponding floating diffusion region within the second semiconductor substrate 351 (see, e.g., FIG. 1C showing first floating diffusion regions 107 coupled to second floating diffusion regions 157 via the plurality of connection pads 143 and connection vias 149) that can be coupled to form the reset transistor and source-follower transistor of the second semiconductor substrate 351. Thus, in the illustrated embodiment, the pixel cell circuitry 355-N of the second semiconductor substrate 351 is coupled to the plurality of pixel cells of the first semiconductor substrate 301 on a per-pixel cell basis. However, in other embodiments, the individual floating diffusion regions (i.e., FD1, FD2, FD3, and FD4) of a given pixel cell are not coupled together and thus may be coupled to the pixel circuitry of the second semiconductor substrate 351 on a per-pixel basis. In other embodiments, a PLHB may couple two or more pixel cells to the second semiconductor substrate 351.

It is appreciated that during operation, image charge photogenerated in response to incident light by the plurality of photodiodes (i.e., PD1, PD2, PD3, and PD4) can be selectively transferred to their respective floating diffusion regions (i.e., FD1, FD2, FD3, FD4) in response to a signal applied to plurality of transfer gates (i.e., TX1, TX2, TX3, and TX4), which may subsequently turn on the source-follower transistor SF supplied by AVDD of the second semiconductor substrate 251 and enable readout to the bit line via the row select transistor RS. It is appreciated the floating diffusion regions (i.e., FD1, FD2, FD3, FD4) and the plurality of photodiodes (i.e., PD1, PD2, PD3, and PD4) can be reset to a pre-determined potential (e.g., RSVDD) via the reset transistor RST. It is appreciated that while the schematic 300 is similar to the 4-T pixel driver circuit, other configurations may also be used (e.g., 3-T, 5-T, or other pixel driver configurations), in accordance with embodiments of the disclosure.

Figure 3B:
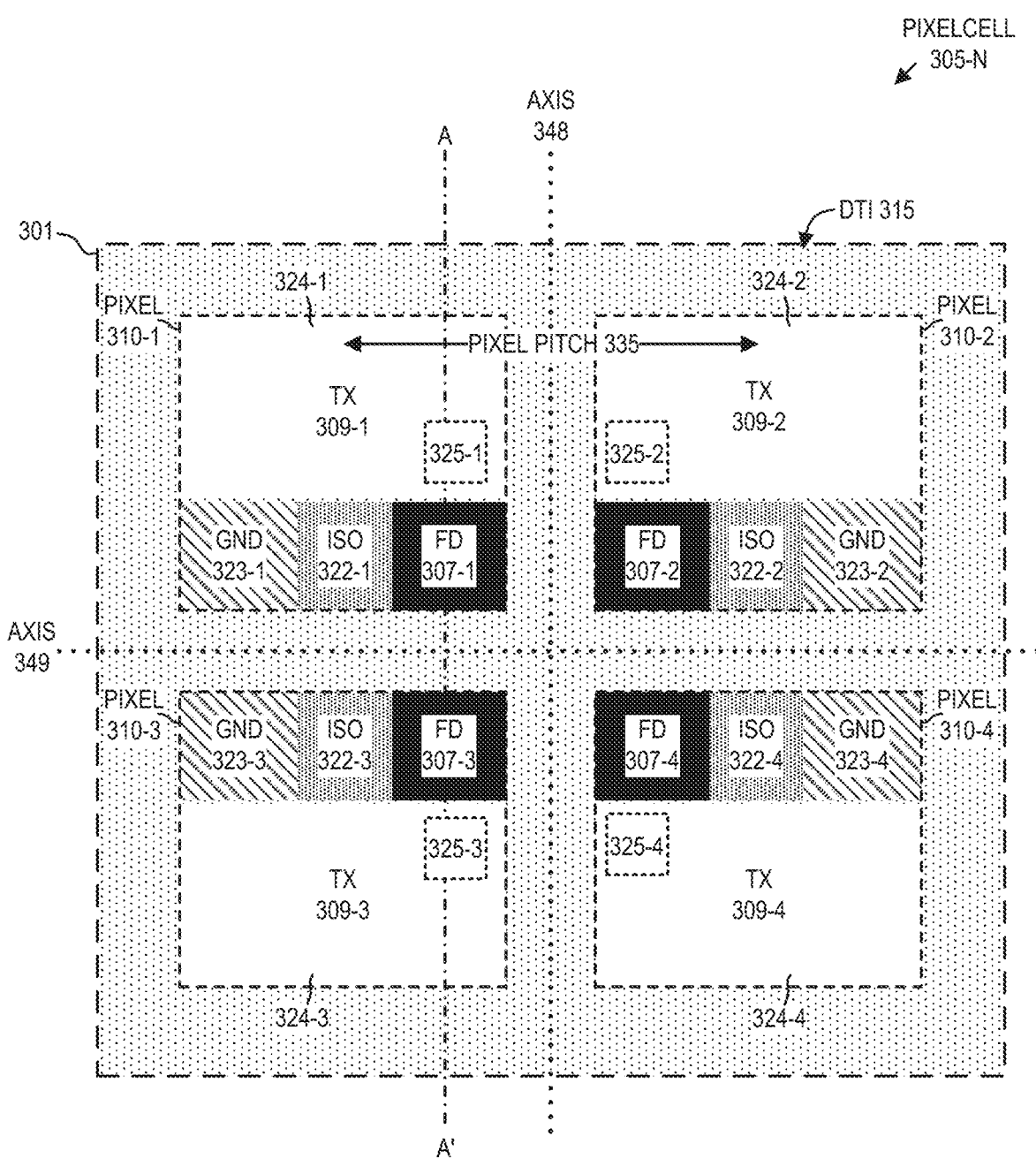
FIG. 3B illustrates a top view of a pixel cell included in a plurality of pixel cells of first semiconductor substrate, in accordance with embodiments of the disclosure.

FIG. 3B illustrates a top view of an example pixel cell 305-N included in a plurality of pixel cells of first semiconductor substrate 301, in accordance with embodiments of the disclosure. More specifically, the top view illustrated in FIG. 3B is representative of a planar view extending through an insulating medium (e.g., insulating medium 130 illustrated in FIG. 1C) towards a first side (e.g., first side 102 illustrated in FIG. 1C) of the first semiconductor substrate 201. The pixel cell configuration illustrated in FIG. 3B is one possible implementation of one or more pixel cells included in the plurality of pixel cells 105 illustrated in FIG. 1A. It is appreciated that certain elements may be omitted or otherwise obstructed from view to avoid obscuring certain aspects of the disclosure.

Referring back to FIG. 3B, pixel cell 305-N includes a two-by-two group of pixels included in the plurality of pixels 310 (e.g., pixels 310-1, 310-2, 310-3, and 310-4) disposed within the first semiconductor substrate 301. As illustrated individual pixels included in the plurality of pixels 310 are separated from one another by a deep trench isolation (DTI) structure 315 disposed in the first semiconductor substrate 301. Similarly, individual pixel cells included in the plurality of pixel cells 305 are separated from one another by the DTI structure 315 (not illustrated). The pixel cell 305-N further includes a plurality of transfer gates (TX) 220 (e.g., transfer gates 309-1, 309-2, 309-3, and 309-4, which respectively correspond to TX1, TX2, TX3, and TX4 illustrated in FIG. 3A), a plurality of floating diffusion regions (FD) 307 (e.g., floating diffusion regions 307-1, 307-2, 307-3, and 307-4, which respectively correspond to FD1, FD2, FD3, and FD4 illustrated in FIG. 3A), a plurality of isolation regions (ISO) 322 (e.g., isolation regions 322-1, 322-2, 322-3, and 322-4), and a plurality of ground contact regions (GND) 323 (e.g., ground contact regions 323-1, 323-2, 323-3, and 323-4, which respectively correspond to the unlabeled grounds coupled to the plurality of photodiodes, PD, and/or the plurality of floating diffusion regions, FD, illustrated in FIG. 3A), which are constituent components of the plurality of pixels 310 included in pixel cell 305-N. It is further appreciated, that each one of the plurality of pixels 310 also includes a corresponding photodiode (see, e.g., FIG. 3A and FIG. 3C), which is obstructed in the view illustrated by FIG. 3B by an associated transfer gate included in the plurality of transfer gates 309 (e.g., pixel 310-1 includes a photodiode covered by or otherwise optically aligned with transfer gate 309-1 when viewed from an insulating medium towards the first side of the first semiconductor substrate 301). Accordingly, in the illustrated embodiment, each pixel included in the plurality of pixels 310 include respective instances of a photodiode, a transfer gate, a ground contact region, a floating diffusion region, and an isolation region disposed in or on the first semiconductor substrate 301 It is appreciated that for a given pixel included in the plurality of pixels 310 of the pixel cell 305-N, a corresponding one of the plurality of isolation regions 322 provides physical separation (i.e., isolation) of a corresponding one of the plurality of floating diffusion region 307 adjacent to one of the plurality of ground contact regions 323.

In the illustrated embodiment, floating diffusion region 307-1, isolation region 322-1, and ground contact region 323-1 are disposed proximate to transfer gate 309-1 of pixel 305-1. Specifically, floating diffusion region 307-1, isolation region 322-1, and ground contact region 323-1 are aligned with a common edge of transfer gate 309-1. Additionally, isolation region 322-1 is disposed between ground contact region 323-1 and floating diffusion region 307-1. It is appreciated that a similar arrangement of elements is mirrored (i.e., reflected) about an axis (e.g., axis 348 and/or 349 with respect to pixel 310-1). As illustrated, the plurality of isolation regions 322 are positioned to isolate the plurality of floating diffusion regions 307 from the plurality of ground contact regions 223 (e.g., isolation region 322-1 is positioned between floating diffusion region 307-1 and ground contact region 323-1 to physically and electrically separate floating diffusion region 307-1 from directly contacting ground contact region 323-1). In some embodiments, the plurality of isolation regions 322 may be individually or collectively coupled to a ground or reference voltage.

Figure 3C:
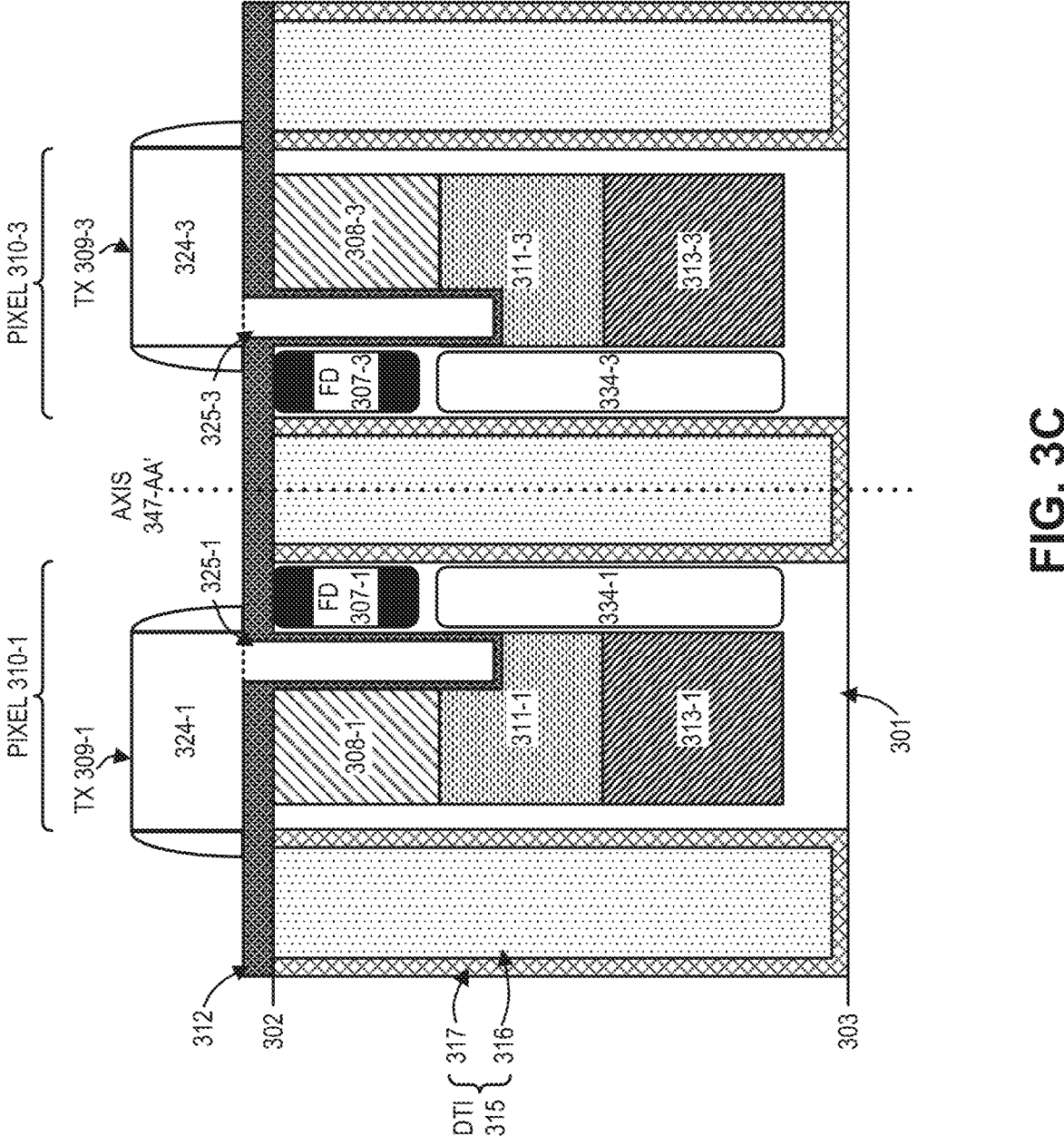
FIG. 3C illustrates a cross-sectional view of the first semiconductor substrate along the line A-A' shown in FIG. 3B, in accordance with embodiments of the present disclosure.

It is further appreciated that the plurality of transfer gates 309 each include one of planar regions 324 (e.g., planar regions 324-1, 324-2, 324-3, and 324-4) and one of vertical regions 325 (e.g., vertical regions 325-1, 325-2, 325-3, and 325-4) to collectively form an individual one of the plurality of transfer gates 309. As illustrated in FIG. 3C, a given one of the vertical regions 325 extends from a respective one of the planar regions 324 into the first semiconductor substrate 301 (e.g., vertical region 325-1 extends from planar region 324-1 to form transfer gate 309-1). In the illustrated embodiment of FIG. 3B, the vertical regions 325 are obstructed from view, but to facilitate discussion of the illustrated embodiment, a dashed line is shown to represent the position of the vertical regions 325 that extend into the first semiconductor substrate 301 from the planar regions 324. As illustrated, the vertical regions 325 are each disposed proximate to a corresponding one of the plurality of floating diffusion regions 307 of the pixel cell 305-N for charge transfer efficiency consideration. In some embodiments, the plurality of isolation regions 322 may each be formed of doped regions having an opposite conductivity type to an adjacent photodiode and floating diffusion region included in the plurality of floating diffusion regions 307. Additionally, each element has a pre-determined lateral area, within manufacturing tolerances appropriate for the utilized fabrication technology node. In some embodiments, the pre-determined lateral area of each of the plurality of floating diffusion regions 307, the plurality of isolation regions 322, and the plurality of ground contact regions 323 are substantially equivalent (e.g., within 10% or less). In other embodiments, the pre-determined lateral areas of each of the plurality of floating diffusion regions 307, plurality of isolation regions 322, and the plurality of ground contact regions 323 are different.

In the illustrated embodiment, the center of each of the plurality of pixels 310 are separated from an adjacent one of the plurality of pixels 310 by a pitch pixel, which may be uniform throughout the plurality of pixels 310 (e.g., the distance between the center of pixel 310-1 and an adjacent pixel such as pixel 310-2 corresponds to pixel pitch 335, which may be the same for each pair of adjacent pixels included in the plurality of pixels 310). In some embodiments, the pixel pitch 335 is less than or equal to 1 μm, less than or equal to 0.7 μm, less than or equal to 0.5 μm, less than or equal to 0.4 μm, or otherwise. In the same or other embodiments, the pixel pitch 335 may have a minimum pitch in accordance with the design rules of a manufacturing node being used for fabrication.

In the illustrated embodiment of FIG. 3B, pixels 310-1, 310-2, 310-3, and 310-4 collectively form pixel cell 305-N of an imaging system (e.g., imaging system 100 illustrated in FIGS. 1A-IC), which may correspond to a minimal repeating unit of the plurality of pixel cells 305. In the same or other embodiment, a pixel cell may correspond to a group of pixels sharing one or more elements (e.g., color filter and/or microlens), but not necessarily correspond to a minimal repeating unit of the plurality of pixel cells 305. For example, in some embodiments a group of pixel cells may form a minimal repeating unit of the plurality of pixel cells 305. As illustrated in FIG. 3B, DTI structure 315 collectively and laterally surrounds each pixel included in the plurality of pixels 310. In other words, the DTI structure 315 physically separates and electrically isolates adjacent pixels included in the plurality of pixels 310 from one another. In the illustrated embodiment, the DTI structure 315 is a contiguous element that extends continuously from the first side of the first semiconductor substrate 301 to a second side of the first semiconductor substrate 301 (see, e.g., DTI 315 illustrated in FIG. 3C).

The plurality of pixels 310 is arranged in rows and columns to form a pixel array. In the illustrated embodiment of FIG. 3B, pixels 310-1, 310-2, 310-3, and 310-4 are arranged in the rows and the columns to collectively form a two-by-two pixel array corresponding to pixel cell 305-N. For example, pixels 310-1 and 310-2 are in a first row included in the rows while pixels 310-3 and 310-4 are in a second row included in the rows. Similarly, pixels 310-1 and 310-3 are in a first column included in the columns and the pixels 310-2 and 310-4 are in a second column included in the columns. It is further appreciated that the pixel 310-1 is adjacent to pixels 310-2 and 310-3 such that there are no intervening pixels disposed between pixel 310-1 and pixel 310-2 or between pixel 310-1 and pixel 310-3. As illustrated, pixel cell 305-N is mirror symmetric about axis 348 and axis 349. In other words, elements of pixel cell 305-N are arranged such that there is reflective symmetry about the axis 348 and the axis 349. It is further noted that in the illustrated embodiment, the axis 348 is orthogonal to the axis 349. It is appreciated that the mirror symmetry facilitates coupling elements included in adjacent pixels for a given pixel cell and/or adjacent pixel cells (see, e.g., FIGS. 3D and 3E in which the floating diffusion regions for a given pixel cell are coupled to one another and subsequently coupled to one of the individual groups of components of the pixel cell circuitry). However, in other embodiments, axis 348 and axis 349 may not be orthogonal to one another, or there may be additional or different axes about which the pixel cell 305-N is mirror symmetric.

Figure 3D:
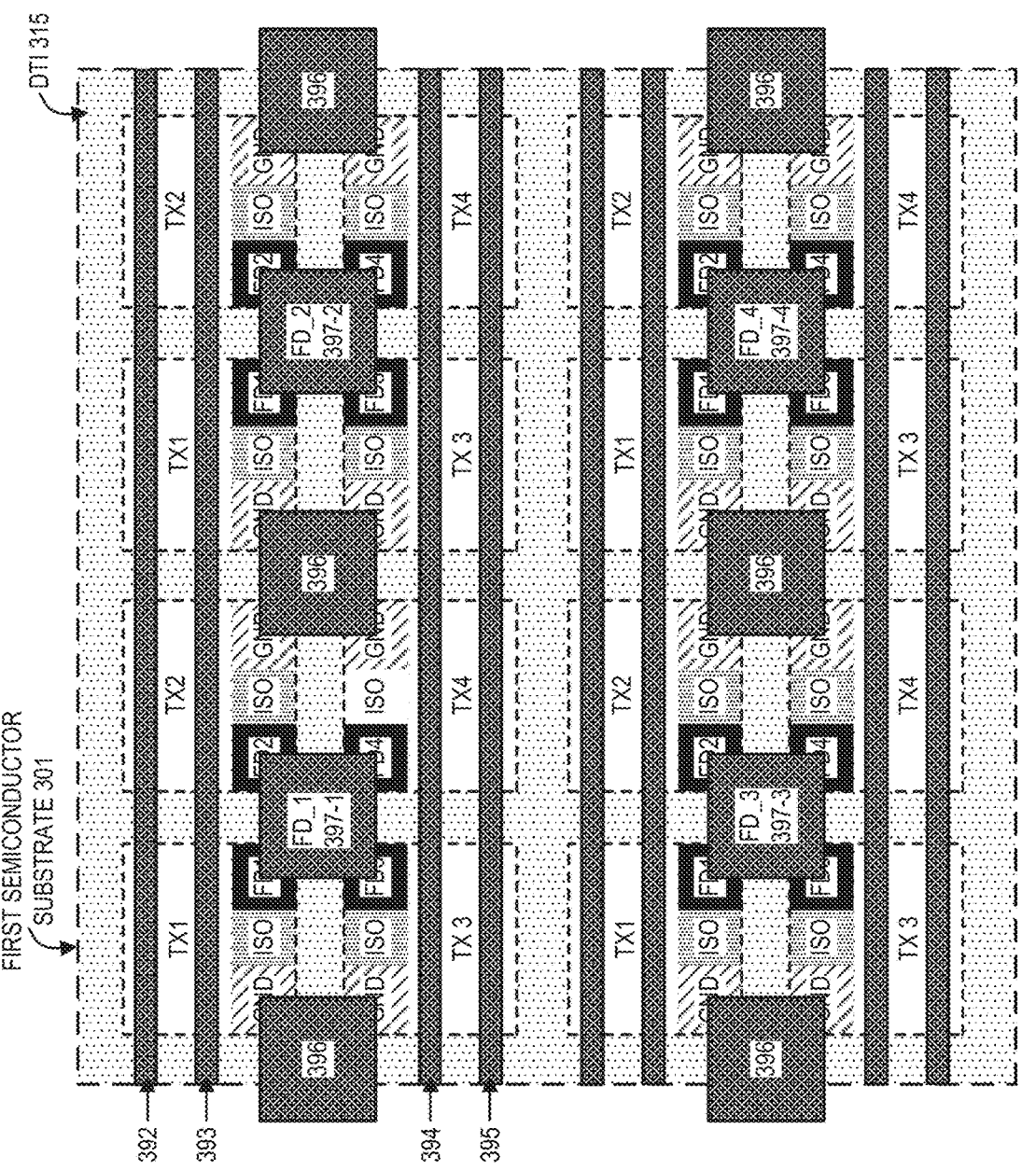
FIG. 3D illustrates an expanded top view of a plurality of pixel cells formed in or on the first semiconductor substrate and a corresponding metallization layer formed in an insulating medium, in accordance with embodiments of the disclosure.

Referring back to FIG. 3B, it is appreciated that respective floating diffusion regions of adjacent pixels included in the pixel cell 305-N are separated from one another such that the DTI structure 315 is disposed between adjacent floating diffusion regions included in the plurality of floating diffusion regions 307 without other intervening elements. In other words, adjacent floating diffusion regions abut the DTI structure 315. For example, the DTI structure 315 is disposed between floating diffusion regions 307-1 and 307-2 without any intervening elements such that the floating diffusion regions 307-1 and 307-2 abut opposite sides of the DTI structure 315. It is appreciated that the illustrated configuration is advantageous when coupling the plurality of floating diffusion regions 307 of a given pixel cell together (e.g., as illustrated in FIGS. 3C and 3D, which shows a simplified layout when interconnecting floating diffusion regions of a given pixel cell). It is further appreciated that the number of pixels included in the plurality of pixels 310 for a given pixel cell may include more of or less pixels (e.g., instead of the two-by-two pixel configuration for the illustrated pixel cell of FIG. 3B, there may be a two-by-four, two-by-eight, four-by-four, or other configurations which incorporate more or less pixels within a given pixel cell).

FIG. 3C illustrates a cross-sectional view of the first semiconductor substrate 301 along the line A-A' shown in FIG. 3B, in accordance with embodiments of the present disclosure. The cross-sectional view includes pinning regions 308-1 and 308-3, doped regions 311-1 and 311-3, deep doped regions 313-1 and 313-3, DTI structure 315 including an inner region 316 and an outer region 317, floating diffusion regions 307-1 and 307-3, and wells 334-1 and 334-3. A gate oxide (e.g., a dielectric layer 312) is disposed proximate to the first side 302 of the first semiconductor substrate 301. The cross-sectional view further includes transfer gate 309-1 including planar region 324-1 and vertical region 325-1, transfer gate 309-3 including planar region 324-3 and vertical region 325-3, and an axis 347-AA'. It is appreciated that elements are hyphenated with a "1" or a "3" to indicate respective association with the first pixel 310-1 or the third pixel 310-3.

In some embodiments, the DTI structure 315 is a monolithic structure with a uniform composition (e.g., an oxide material such as silicon dioxide, a dielectric material having refractive index lower than the first semiconductor substrate 301, or a different insulating material). In the illustrated embodiment, the DTI structure 315 includes the inner region 316 (e.g., formed of polycrystalline silicon, a metal such as tungsten or aluminum, an insulating material with a refractive index lower than a corresponding refractive index of the first semiconductor substrate 301, or an oxide material such as silicon dioxide) that is surrounded by the outer region 317 (e.g., an insulating material such as silicon dioxide, or high k material such as aluminum oxide, hafnium oxide, tantalum oxide, zirconium oxide, or other material). It is appreciated that in some embodiments the DTI structure 315 may correspond to an attenuation layer that may reflect, absorb, diffract, or otherwise impede electrical and/or optical crosstalk between adjacent pixels included in the plurality of pixels 310.

In the illustrated embodiment, pixels 310-1 and 310-3 each include a respective photodiode included in a plurality of photodiodes 304 (see, e.g., FIG. 3A, such as PD1 and PD3). In one embodiment, pinning region 308-1, doped region 311-1, and deep doped region 313-1 in combination with the first semiconductor substrate 301 collectively form a pinned photodiode corresponding to photodiode PD1, which may be representative of any of the photodiodes included in the plurality of photodiodes 104 illustrated in FIGS. 1B and 1C (e.g., photodiode 104-1). However, it is appreciated that in other embodiments, different photodiode configurations may be utilized. In some embodiments, doped regions 311-1 and 311-3 and deep doped regions 313-1 and 313-3 are each a first conductivity type (e.g., N-type or P-type electrical conductivity) while the first semiconductor substrate 301 and pinning regions 308-1 and 308-3 are each a second conductivity type (e.g., P-type or N-type electrical conductivity) opposite of the first conductivity type. It is appreciated that in some embodiments a first doping concentration of the doped regions 311-1 and 311-3 is different than a second doping concentration of the deep doped regions 313-1 and 313-3. In some embodiments, the doping concentration of the pinning regions 308-1 and 308-3 is configured to be greater than the doping concentration of the first semiconductor substrate 301.

As illustrated in FIG. 3C, each of the plurality of transfer gates 309 includes a respective planar region (e.g., planar regions 324-1 and 324-3) electrically coupled to a vertical region (e.g., vertical regions 325-1 and 325-3). Disposed between the plurality of transfer gates 309 and the plurality of photodiodes (e.g., pinning regions 308-1 and 308-3, doped regions 311-1 and 311-3, and deep doped regions 313-1 and 313-3) is dielectric layer 312, which provides an insulating barrier (e.g., to form transfer transistors for readout). In some embodiments the dielectric layer 312 is silicon dioxide, hafnium oxide, aluminum oxide, or any other insulating material with suitable properties for forming a gate dielectric of transfer transistors. In some embodiments, the wells 334-1 and 334-3 correspond to a doped well regions having an opposite conductivity type relative to a conductivity type of the doped regions 311-1 and 311-3, deep doped region 313-1 and 313-3, and/or floating diffusion regions 307-1 and 307-3.

In the illustrated embodiment, the planar regions 324-1 and 324-3 laterally extend over the underlying photodiode to protect the underlying photodiode from contamination and/ or damage during processing steps subsequent to the formation of the underlying photodiode on the first side 302 of the first semiconductor substrate 301. Accordingly, the planar region of the transfer gate associated with the underlying photodiode (e.g., planar region 324-1 of transfer gate 309-1 in the case of pixel 310-1) is optically aligned with the underlying photodiode to cover an entirety of a lateral area of the underlying photodiode when the first semiconductor substrate 301 is viewed from the first side 302. It is further appreciated that pixel 310-1 is mirror symmetric with pixel 310-3 about the axis 347-AA'. In other words, in some embodiments there is reflective symmetry through the first semiconductor substrate 301 about the axis 347-AA', which is orthogonal to both the axis 348 and the axis 349 illustrated in FIG. 3B.

FIG. 3D illustrates an expanded top view of a plurality of pixel cells formed in or on the first semiconductor substrate 301 and a corresponding metallization layer (e.g., a first metal layer "M1") formed in an insulating medium, in accordance with embodiments of the disclosure. It is appreciated that the plurality of pixel cells corresponds to instances of the pixel cell 305-N illustrated in FIGS. 3A-3C, in which each pixel cell included in the plurality of pixel cells is laterally surrounded and separated from each other pixel cell by DTI 315. In the illustrated embodiment, the corresponding metallization layer includes floating diffusion contacts 397 (e.g., FD_1 397-1, FD_2 397-2, FD_3 397-3, and FD_4 397-4), each electrically coupling the floating diffusion regions (e.g., FD1, FD2, FD3, and FD4) for a given pixel cell (e.g., a group of pixels such as pixels 310-1, 310-2, 310-3, and 310-4 that form pixel cell 305-N illustrated in FIG. 3B). In other words, a first floating diffusion region (e.g., FD1) is coupled to one or more additional floating diffusion regions (e.g., FD2, FD3, and/or FD4) included in pixel cell 305-N via a floating diffusion contact (e.g., FD_1 397-1), which may be coupled to a connection pad (e.g., connection pad 143-1 illustrated in FIG. 1C and/or connection pad 243-1 illustrated in FIGS. 2A-2D). In some embodiments, the FD contacts 397 may be one possible implementation of the plurality of contacts 254 illustrated in FIGS. 2A-2D to couple the floating diffusion regions (e.g., FD1, FD2, FD3, FD4) to a plurality of connection pads (e.g., the plurality of connection pads 243 illustrated in FIGS. 2A-2D) via a plurality of connection vias (e.g., connection vias 249 illustrated in FIGS. 2A-2D). In the same or other embodiments, the FD contacts 397 illustrated in FIG. 3D may facilitate the interconnection between the floating diffusion regions (e.g., first floating diffusion regions 107 illustrated in FIG. 1C) of each pixel cell and one or more components in or on a second semiconductor substrate (e.g., second floating diffusion regions 157 disposed in or on the second semiconductor substrate 254 illustrated in FIG. 1C). In some embodiments, the FD contacts 397 of FIG. 3C may be disposed in the one or more additional insulating layers 131 and/or the one or more additional insulating layers 157 to provide the interconnection between the plurality of connection pads 143 and the first floating diffusion regions 107 and/or the second floating diffusion regions 157 illustrated in FIG. 1C.

Referring back to FIG. 3D, the corresponding metallization layer further includes ground contacts 396 that couple the ground contact regions (e.g., GND) of adjacent pixel cells. However, it is appreciated that in some embodiments, a subsequent metal layer (e.g., a second metal layer "M2") may couple all ground contacts 396 of all pixel cells together. The corresponding metallization layer also includes metal wires, lines, or traces 392, 393, 394, and 395, which respectively couple the plurality of transfer gates for a respective row together. In some embodiments, metal trace 392 couples transfer gates included in the plurality of transfer gates of a given row denoted as "TX1" together while metal trace 393 couples transfer gates of the given row denoted as "TX2" together. Similarly, in the same or other embodiments, metal trace 394 couples transfer gates included in the plurality of transfer gates of a given row denoted as "TX3" together while metal trace 395 couples transfer gates of the given row denoted as "TX4" together. In other words, transfer gates included in the plurality of transfer gates along a common row may not necessarily be coupled together (e.g., TX1 and TX2 of the common row may not be electrically coupled together via the metal traces 392 or 393). In other embodiments, transfer gates included in the plurality of transfer gates of a common row may be coupled together.

Figure 3E:
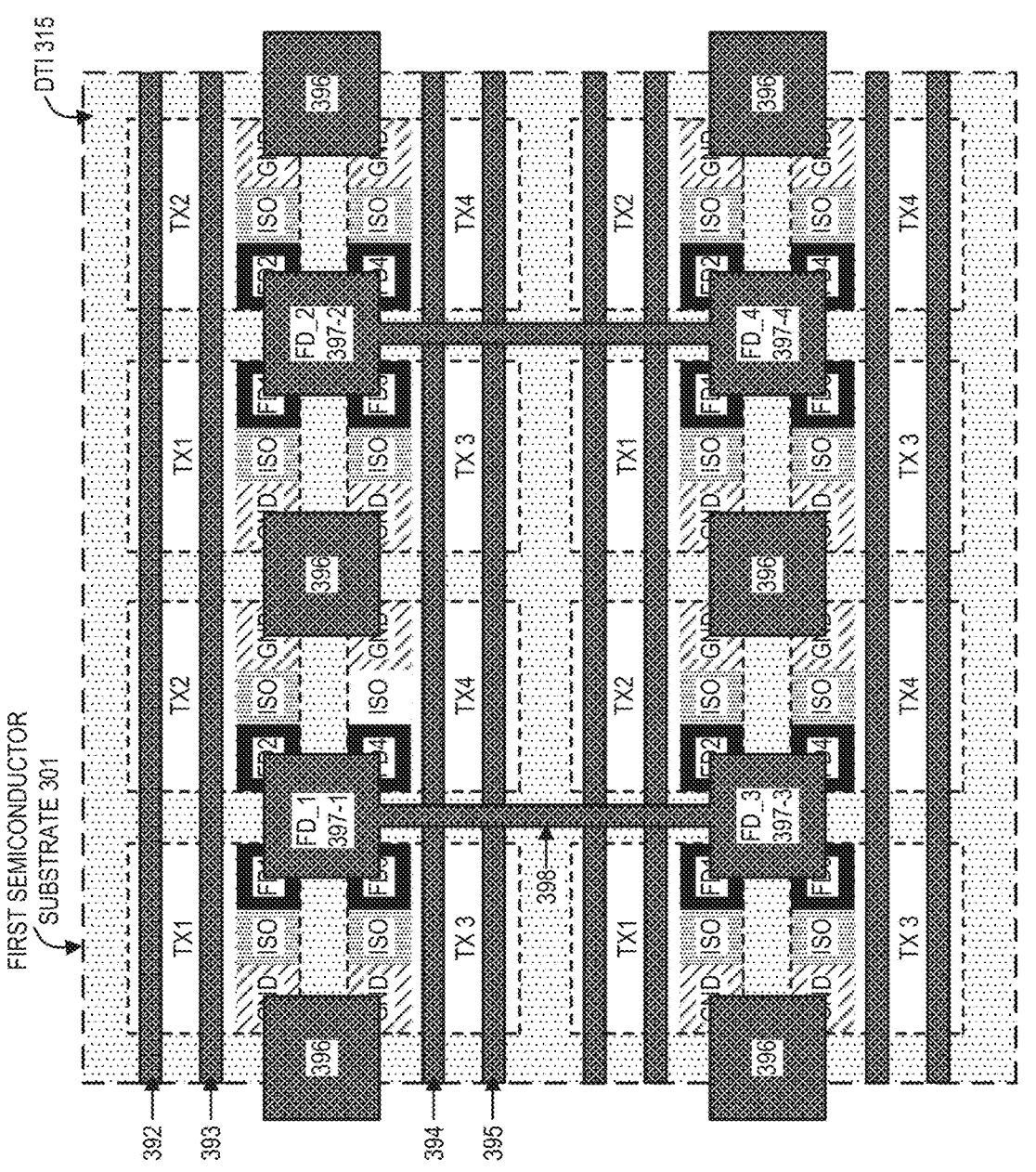
FIG. 3E illustrates an alternative configuration of the corresponding metallization layer illustrated in FIG. 3D, in accordance with an embodiment of the disclosure.

FIG. 3E illustrates an alternative configuration of the corresponding metallization layer illustrated in FIG. 3D, in accordance with an embodiment of the disclosure. Specifically, adjacent contacts included in the FD contacts 397 may be coupled together for a pixel cell unit that includes at least two pixel cells having their floating diffusion regions coupled together. For example, floating diffusion regions of a group of four pixels included in a first pixel cell are coupled together via FD_1 397-1 and floating diffusion regions of a different group of four pixels included in a second pixel cell adjacent to the first pixel cell are coupled together via FD_3 397-3. The FD contacts 397-1 and 397-3 are subsequently coupled together (e.g., in the same or a different metallization layer) via a metal line 398 (e.g., a metal wire or trace disposed in the insulating medium). In doing so, a two-by-eight pixel unit may be formed that includes two pixel cells. It is appreciated that by coupling two of the FD contacts 397 together, interconnection between substrates at the bonding interface between the substrates can be simplified. For example, in one embodiment, FD_1 397-1 may be directly coupled to a connection pad (e.g., one of the connection pads included in the plurality of connection pads 143 illustrated in FIGS. 1B-1C and/or the plurality of connection pads 243 illustrated in FIGS. 2A-2D) included in a plurality of connection pads while FD_3 397-3 would not be directly coupled to one of the connection pads included in the plurality of connection pads. Rather, FD_3 397-3 may be indirectly interconnected between substrates since metal line 398 electrically couples FD_1 397-1 and FD_3 397-3. In other words, floating diffusion contact FD_1 397-1 is coupled to a floating diffusion region of a first pixel cell (e.g., FD1 directly contacting FD_1 397-1) and floating diffusion contact FD_3 397-3 is coupled to a floating diffusion region of a second pixel cell (e.g., FD1 directly contacting FD_3 397-3), which are in turn coupled together via a floating diffusion interconnect (e.g., metal wire 398) disposed in the insulating medium. Advantageously, crosstalk within the insulating medium (or more specifically at the bonding interface) may be mitigated since the separation distance between active connection pads may be increased (see, e.g., FIGS. 4A-4H).

FIGS. 4A-4H correspond to different configurations of a plurality of CPS structures 441 (e.g., CPS structures 441-1, 441-2, 441-3, 441-4, 441-5, 441-6, 441-7, 441-8, 441-9, 441-10, 441-11, 441-12, 441-13, 441-14, 441-15, 441-16, 441-17, 441-18, 441-19, 441-20, and so on) and plurality of connection pads 443 (e.g., "active" connection pads 443-1, 443-2, 443-3, 443-4, 443-5, 443-6, 443-7, 443-8, 443-9, 443-10, 443-11, 443-12, 443-13, 443-14, 443-15, 443-16, 443-17, 443-18, 443-19, 443-20 and so on and "inactive" connection pads 443-1DM, 443-2DM, 443-3DM, 443-4DM, 443-5DM, 443-6DM, 443-7DM, 443-8DM, 443-9DM, 443-10DM, 443-11DM, 443-12DM, 443-13DM, 443-14DM, 443-15DM, 443-16DM, 443-17DM, 443-18DM, 443-19DM, 443-20DM, and so on) disposed in an insulating medium 430, in accordance with embodiments of the disclosure. In some embodiments, the plurality of CPS structures 441 illustrated in FIGS. 4A-4H may be implemented as the plurality of CPS structures 141 illustrated in FIGS. 1B-1C and/or the plurality of CPS structures 241 illustrated in FIGS. 2A-2D. In the same or other embodiments, the plurality of connection pads 443 illustrated in FIGS. 4A-4H may be implemented as the plurality of connection pads 143 illustrated in FIGS. 1B-1C and/or the plurality of connection pads 243 illustrated in FIGS. 2A-2D. In the same or other embodiments, the insulating medium 430 illustrated in FIGS. 4A-4H may be implemented as the insulating medium 130 illustrated in FIGS. 1B-1C and/or the insulating medium 230 illustrated in FIGS. 2A-2D. It is appreciated that the plurality of CPS structures 441 and the plurality of connection pads 443 disposed in the insulating medium 430 may share a common lateral plane (e.g., as illustrated in FIGS. 1C-2D) within the insulating medium 430. In other words, the plurality of CPS structures 441 and the plurality of connection pads 443 may be disposed in common dielectric layers (e.g., first insulating layer 130-1 and second insulating layer 130-2 illustrated in FIG. 1C and first insulating layer 230-1 and second insulating layer 230-2 illustrated in FIGS. 2A-2D), which include where different substrates interface (e.g., bonding interface 140 illustrated in FIG. 1C and bonding interface 240 illustrated in FIGS. 2A-2D).

Referring back to FIGS. 4A-4H, it is noted that the labeling of the plurality of connection pads 443 distinguishes between "active" connection pads and "inactive" connection pads. Specifically, "inactive" connection pads are suffixed with "DM" such that connection pads 443-1DM, 443-2DM, 443-3DM, and 443-4DM, 443-5DM, 443-6DM, and so on correspond to dummy connection pads that are electrically isolated from the connecting substrates. In other words, while the dummy connection pads may facilitate hybrid bonding between first and second semiconductor substrates to promote adhesion between the semiconductor substrates, they do not facilitate an electrical connection between electrical components disposed on different substrates. Specifically, the "active" connection pads (e.g., 443-1, 443-2, 443-3, 443-4, 443-5, 443-6, and so on) are coupled to underlying floating diffusion contacts or contact vias 497 (e.g., 497-1, 497-2, 497-3, 497-4, 497-5, 497-6, and so on) while the dummy connection pads (e.g., 443-1DM, 443-2DM, 443-3DM, 443-4DM, 443-5DM, 443-6DM, and so on) may be electrically isolated from the underlying floating diffusion contacts (e.g., there is no connection via to couple the dummy connection pads to the underlying floating diffusion contacts). In such an embodiment, adjacent floating diffusion contacts may be coupled by a metal line (see, e.g., FIG. 3E showing metal line 398 coupling FD_1 397-1 and FD_3 397-3). For example, when FIGS. 4A-4H are viewed in context of FIG. 3E, one of the plurality of connection pads 443 (e.g., connection pad 443-1) may be coupled to FD_1 397-1 via a connection via while an adjacent dummy connection pad included in the plurality of connection pads 443 (e.g., connection pad 443-1DM) is not coupled to FD_3 397-3 via a connection via. Accordingly, in some embodiments, the plurality of connection pads 443 may vertically overlap with underlying contacts (e.g., to couple floating diffusion regions or other electrical components disposed in or on first and second semiconductor substrates). It is advantageous in that crosstalk between active connection pads and dummy connection pads disposed adjacent to one another can be reduced significantly.

Figures 4A, 4B:
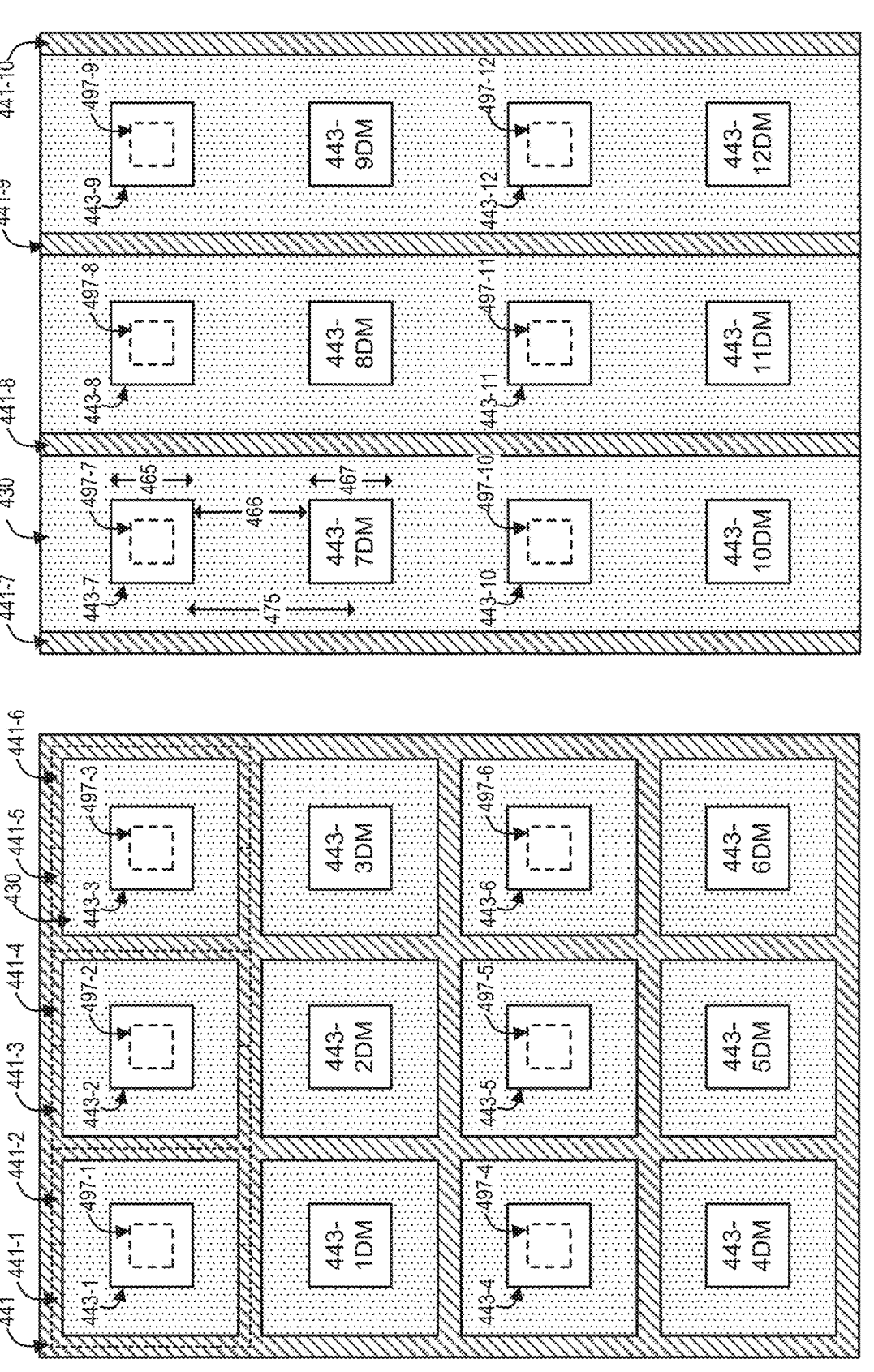
FIGS. 4A-4H correspond to different configurations of a plurality of CPS structures and plurality of connection pads disposed in an insulating medium, in accordance with embodiments of the disclosure.
Figure 4D:
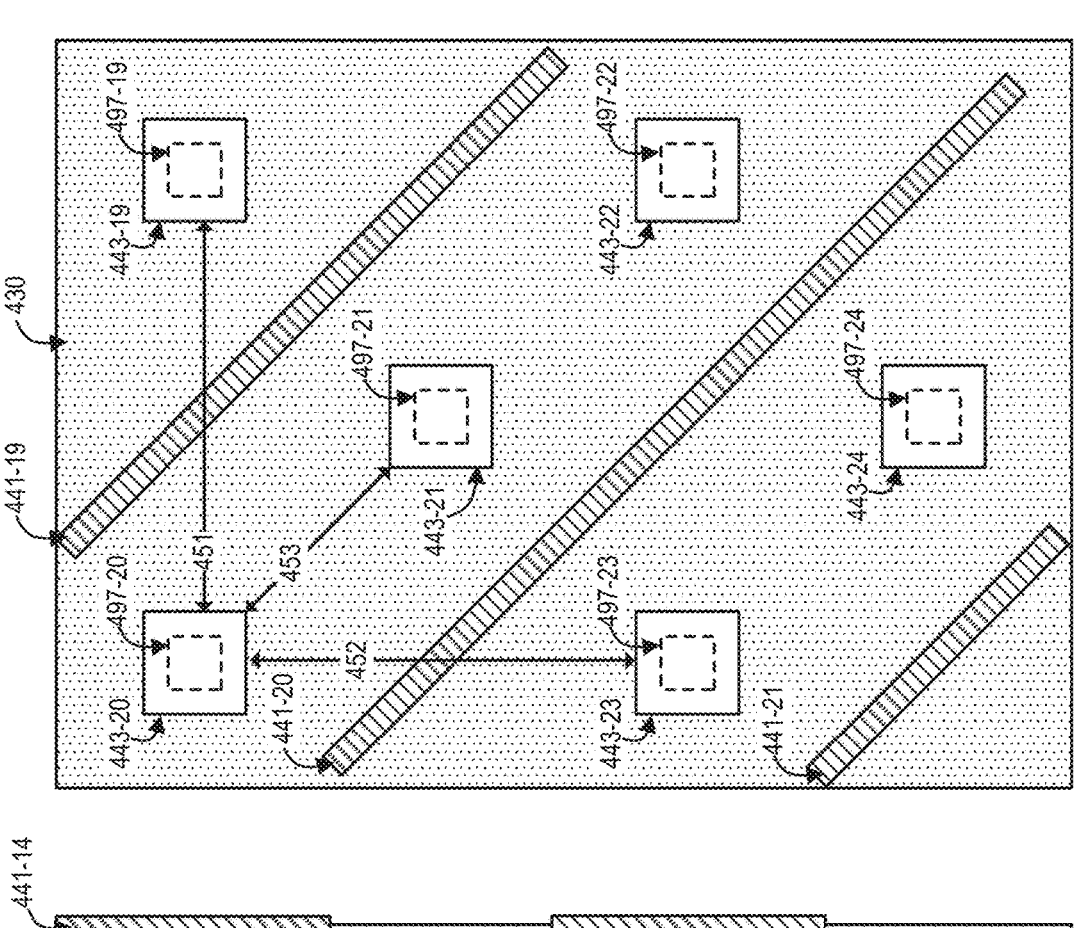
Figure 4C:
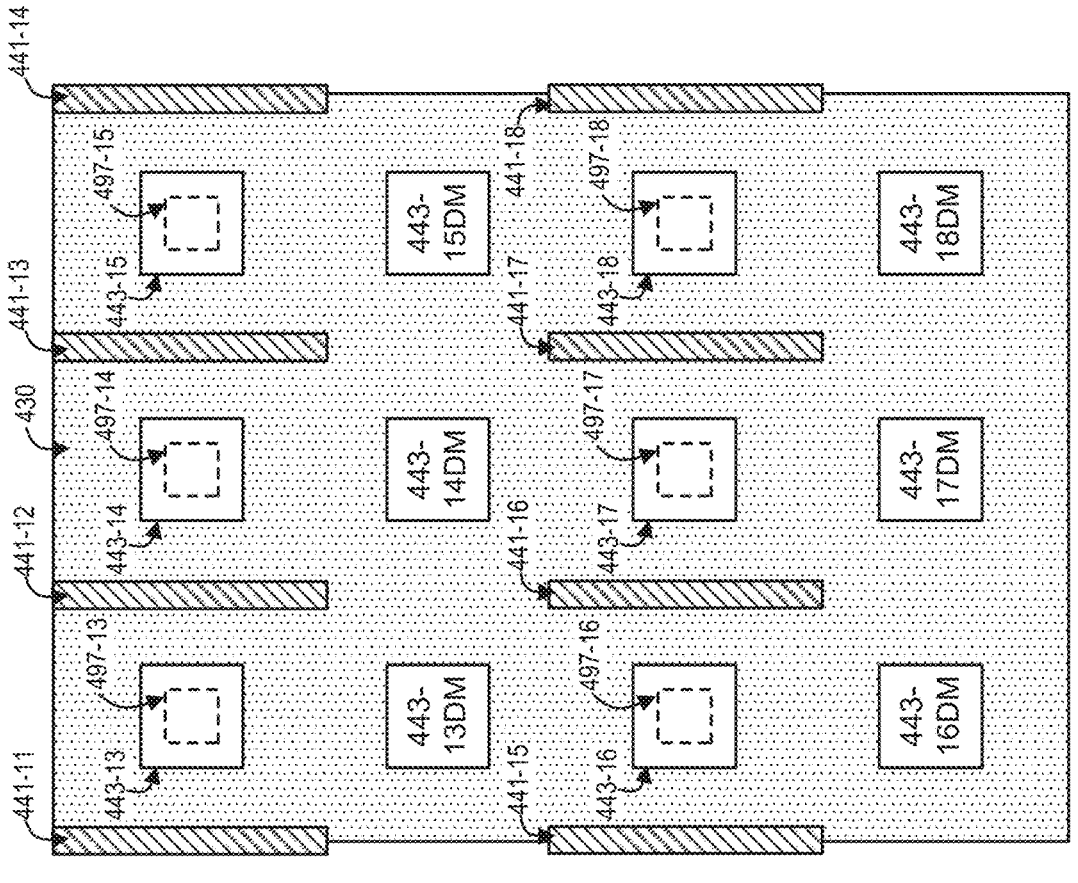

It is further noted that the plurality of connection pads 443 illustrated in FIGS. 4A-4H are arranged in rows and columns to form a connection pad array. For example, in FIG. 4C, connection pads 443-13, 443-14, and 443-15 are all disposed along a common row while connection pads 443-13, 443-13DM, 443-16, and 443-16DM are disposed along a common column. In some embodiments, the "inactive" connection pads or dummy connection pads are positioned to separate rows (or columns) of active connection pads. For example, in FIG. 4C, dummy connection pads 443-13DM, 443-14DM, and 443-15DM are disposed between adjacent rows of active connection pads included in the connection pad array (e.g., a row including connection pads 443-13, 443-14, and 443-15 is separated from a row including connection pads 443-16, 443-17, and 443-18 by a row of dummy connection pads including 443-13DM, 443-14DM, and 443-15DM as illustrated in FIG. 4C). For example, dummy connection pad 443-13DM is disposed between connection pad 443-13 and 443-16 as illustrated in FIG. 4C. However, it is appreciated that the dummy connection pads are optional and that in other embodiments may be omitted or otherwise configured as active connection pads with a similar configuration of CPS structures included in the plurality of CPS structures 441.

Referring back to FIGS. 4A-4H, it is appreciated that the individual CPS structures included in the plurality of CPS structures 441 extend a first length along a common direction while the plurality of connection pads 443 extend respective lengths along the common direction that is less than the first length the plurality of CPS structures 441 extend. In other words, the first length the plurality of CPS structures 441 extend is greater than the respective lengths of the plurality of connection pads 443 along the common direction. For example, referring to FIG. 4B, CPS structures 441-7 and 441-8 and connection pads 443-7 and 443-7DM each extend corresponding lengths along direction 475. However, the lengths CPS structures 441-7 and 441-8 extend along direction 475 is greater than the respective lengths that connection pads 443-7 and 443-7DM extend. This is similarly true for other embodiments illustrated in FIGS. 4A-4H. For example, in FIG. 4H, the lengths CPS structures 441-63 and 441-64 extend along direction 476 is greater than the respective lengths that connection pads 443-46 and 443-40DM extend. In other words, corresponding lengths of the individual CPS structures included in the plurality of CPS structures 441 illustrated in FIGS. 4A-4H are greater than at least one lateral dimension of individual connection pads included in the plurality of connection pads 443.

Figures 4E, 4F:
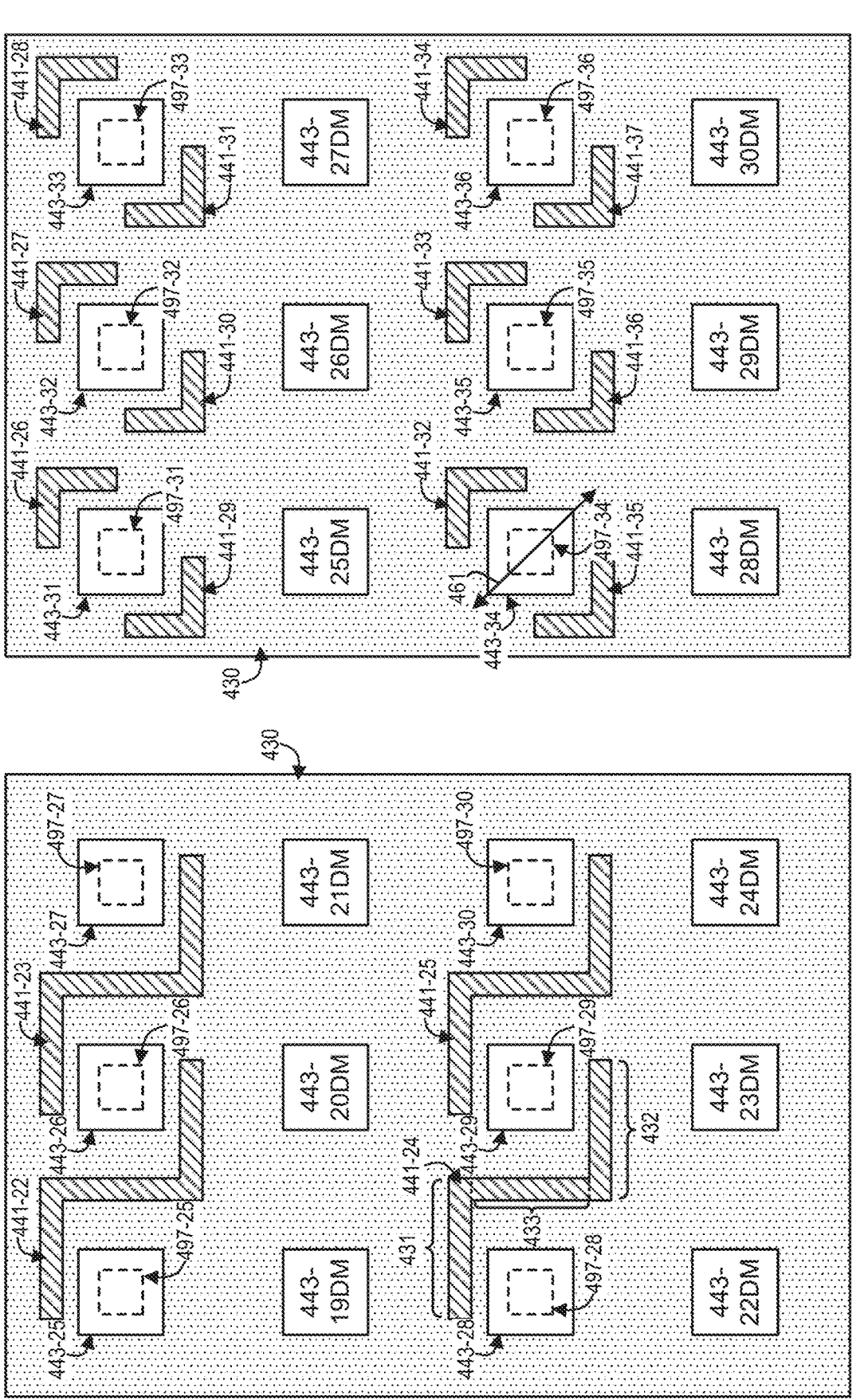
Figures 4G, 4H:
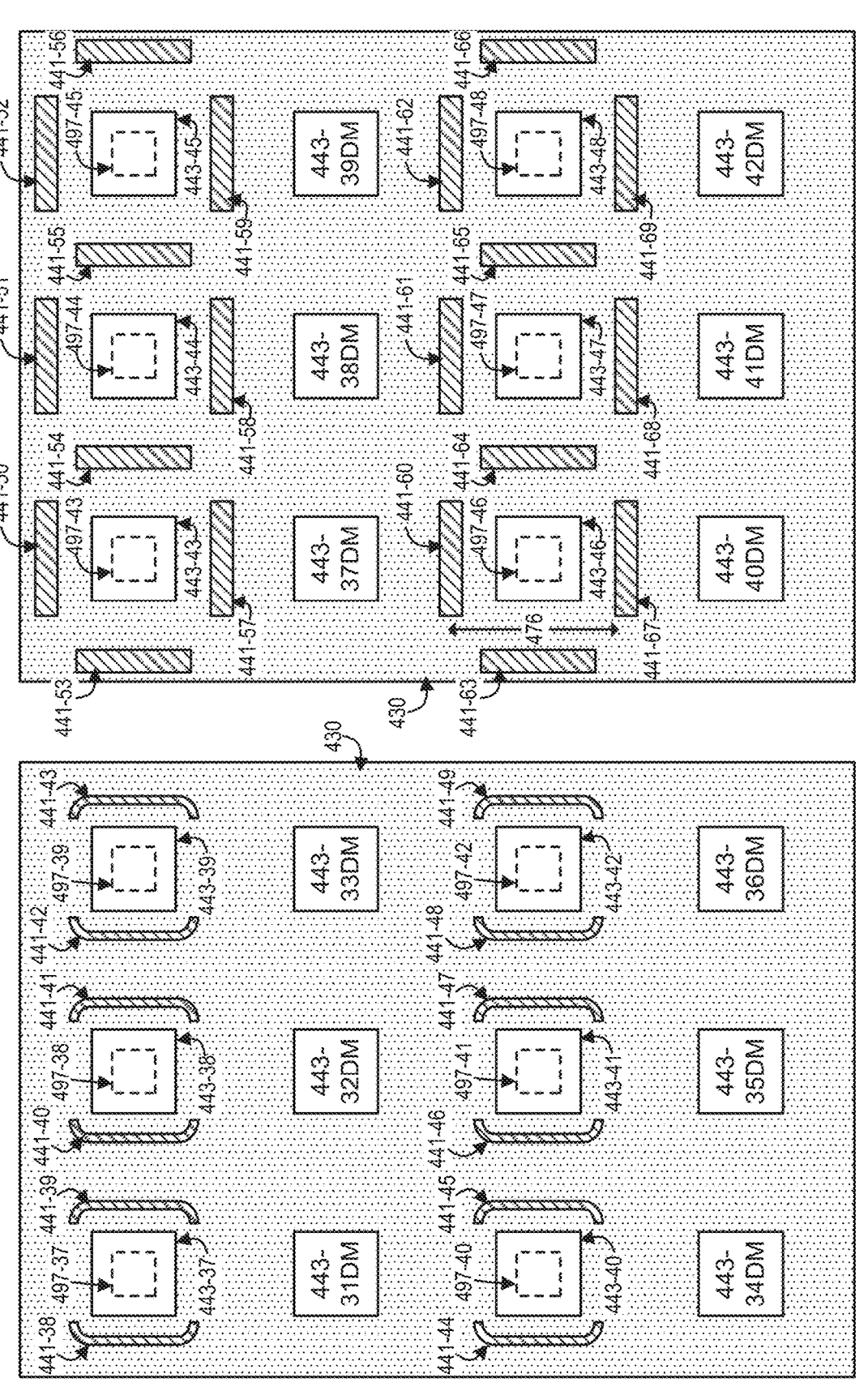

Additionally, in many of the embodiments illustrated in FIG. 4A-4H, the plurality of CPS structures 441 laterally surround, at least partially, individual connection pads included in the plurality of connection pads 443 within the insulating medium 430 to collectively mitigate crosstalk between a given connection pad included in the plurality of connection pads 443 and any adjacent connection pads. In some embodiments, the plurality of connection pads 443 are entirely laterally surrounded by the plurality of CPS structures 441. For example, in FIG. 4A, connection pad 443-1 is entirely laterally surrounded by CPS structures 441-1 and 441-2 within the insulating medium 430. In other embodiments, connection pads included in the plurality of connection pads 443 are only partially laterally surrounded. For example, in FIG. 4C, connection pad 443-17 is partially laterally surrounded by CPS structures 441-16 and 441-17. This is similarly true for other embodiments, such as FIG. 4E, in which connection pad 443-26 is partially laterally surrounded by CPS structure 441-22 and 441-23, for example. Additionally, FIG. 4H illustrates connection pad 443-43 partially laterally surrounded by CPS structures 441-50, 441-53, 441-54, and 441-57. It is appreciated that partially or completely laterally surrounding the plurality of connection pads 443 within the insulating medium 430 as illustrated in FIGS. 4A-4H may reduce crosstalk (e.g., coupling percentage) by an order of magnitude or more.

It is appreciated that in most embodiments (e.g., the embodiments illustrated by FIG. 4B-4H) the plurality of CPS structures 441 are distinct and separate structures that do not directly contact one another. For example, in FIGS. 4B-4H, the plurality of CPS structures 441 do not direct contact one another (i.e., each of the plurality of CPS structures does not directly contact any other CPS structure included in the plurality of CPS structures 441). By having CPS structures be distinct and separate, they may be advantageously disposed in different layers of the insulating medium 430 (e.g., as illustrated in FIG. 2B), may be coupled to receive a pre-determined bias independently from the same or different power terminals or power sources located on the same or different substrates (e.g., for additional control of crosstalk mitigation), or may otherwise facilitate space optimization, coupling capacitance minimization and/or ease of substrate alignment. In other embodiments, the plurality of CPS structures 441 may be directly coupled to one another (see, e.g., FIG. 4A). For example, in FIG. 4A, the plurality of CPS structures 441 form a monolithic structure that collectively laterally surrounded each of the plurality of connection pads 443. More specifically individual segments entirely laterally surround a given one of the plurality of connection pads 443 (e.g., CPS structures 441-1 and 441-2 entirely laterally surround connection pad 443-1 while CPS structures 441-3 and 441-4 entirely laterally surround connection pad 443-2, and so on).

Referring back to FIGS. 4A-4H, it is appreciated that two or more CPS structures included in the plurality of CPS structures 441 may respectively form an instance of a repeat pattern laterally surrounding a given connection pad included in the plurality of connection pads 443. In some embodiments, each connection pad included in the plurality of connection pads 443 is laterally surrounded by a corresponding instance of the repeat pattern. For example, in FIG. 4A, CPS structures 441-1 and 441-2 form a repeat pattern laterally surrounds connection pad 443-1. Additional instances of the repeat pattern laterally surrounding other connection pads included in the plurality of connection pads 443 (e.g., CPS structures 441-3 and 441-4 form a second instance of the repeat pattern that laterally surrounds connection pad 443-2). This is similarly the case in other embodiments illustrated in FIGS. 4B-4H. For example, in FIG. 4E connection pad 443-26 is laterally surrounded by CPS structure 441-22 and 441-23 to form an instance of a repeat pattern. In FIG. 4F, connection pad 443-35 is laterally surrounded by an instance of a repeat pattern that includes CPS structure 441-33 and 441-36. In FIG. 4H, connection pad 443-48 is laterally surrounded by an instance of a repeat pattern that includes CPS structures 441-62, 441-65, 441-66, and 441-69.

FIG. 4A illustrates a configuration of the plurality of CPS structures 441 (e.g., 441-1 through 441-6) disposed in the insulating medium 430 to laterally encapsulate or otherwise surround the plurality of connection pads 443 (e.g., active connection pads 443-1 through 443-6 coupled to contacts/vias 497-1 through 497-6 and inactive connection pads 443-1DM through 443-6DM), in accordance with an embodiment of the disclosure. For example, connection pad 443-1 is laterally encapsulated by CPS structures 441-1 and 441-2. It is appreciated that each of the plurality of connection pads 443 are laterally surrounded by the plurality of CPS structures 441. It is appreciated that in some embodiments, the CPS structures 441 illustrated in FIG. 4A may collectively form a monolithic structure such that the CPS structures 441 are integrally connected. In such an embodiment, the CPS structure 441 may be entirely formed or otherwise disposed in the same insulating layer (e.g., in first insulating layer 230-1 or in second insulating layer 230-2 of FIG. 2A). Portions of the monolithic structure may also be segmented (e.g., as illustrated for sake of discussion) to form respective repeat units that surround each of the plurality of connection pads 443. For example, portions of the monolithic structure may also be segmented and formed in separate insulating layers such as one of the CPS structures 441-1 and 441-2 formed in one insulating layer (e.g., first insulating layer 230-1) and the other one of the CPS structures 441-1 and 441-2 formed in another insulating layer (e.g., second insulating layer 230-2) as shown in FIG. 2B. It is further appreciated that the illustrated embodiment shows the plurality of connection pads 443 are each entirely surrounded by a pair of the CPS structures 441 (e.g., connection pad 443-1 is entirely laterally surrounded by CPS structures 441-1 and 441-2 while connection pad 443-2 is entirely laterally surrounded by CPS structures 441-3 and 441-4) such that each of connection pads 443 may be completely shielded from adjacent connection pads.

FIG. 4B illustrates a configuration of the plurality of CPS structures 441 (e.g., 441-7 through 441-10) disposed in the insulating medium 430 where columns (or rows) of the plurality of connection pads 443 (e.g., active connection pads 443-7 through 443-12 coupled to contacts/vias 497-7 through 497-12 and inactive connection pads 443-7DM through 443-12DM) are separated from one another by CPS structures included in the plurality of CPS structures 441, in accordance with an embodiment of the disclosure. In the illustrated embodiment, the plurality of CPS structures 441 extend parallel to one another. For example, CPS structure 441-7 is parallel to CPS structures 441-8 and 441-9 when viewed from a plan view as illustrated. As illustrated, CPS structures 441-7, 441-8, and 441-9 extend contiguously a distance greater than or equal to a summation of a first separation distance 466 between connection pad 443-7 and 443-7DM, a lateral dimension 465 of connection pad 443-7 and a lateral dimension 467 of connection pad 443-7DM. It is appreciated that the plurality of CPS structures 441 may be further configured to extend a greater distance contiguously (e.g., greater than or equal to the distance between multiple connection pads included in the plurality of connection pads 443 such as the distance between connection pad 443-7 and 443-10DM). In some embodiments, a lateral separation between each of CPS structures 441 and adjacent active connection pads 443 may be the substantially the same. For example, CPS structure 441-7 disposed in between active connection pads 443-7 and 443-8 may have substantially the same lateral distance (e.g., along x-direction) to each of connection pads 443-7 and 443-8. It is appreciated that the configuration of the plurality of CPS structures 441 illustrated in FIG. 4B may have the benefit of shielding adjacent active connection pads 443 with ease of substrate alignment and minimally increasing coupling capacitance between active connection pad (e.g., connection pads 443-13, 443-14, 443-15, and so on) and the nearby CPS structures 441.

FIG. 4C illustrates a configuration of the plurality of CPS structures 441 (e.g., 441-11 through 441-18) disposed in the insulating medium 430 where active connection pads included in the plurality of connection pads 443 (e.g., 443-13 through 443-18 coupled to contacts/vias 497-13 through 497-18) are separated by CPS structures included in the plurality of CPS structures 441, in accordance with an embodiment of the disclosure. Similar to the configuration illustrated in FIG. 4B, the plurality of CPS structures 441 (for a given row) are parallel to one another. In the illustrated embodiment of FIG. 4C, the plurality of CPS structures 441 form rows and columns of CPS structures that separate active connection pads included in the plurality of connection pads 443. However, it is appreciated that inactive or dummy connection pads (e.g., 443-13DM, 443-14DM, 443-15DM, 443-16DM, 443-17DM, 443-18DM, and so on) are not separated from one another by the plurality of CPS structures 441 as the bulk of the crosstalk may be between active connection pads (e.g., connection pads 443-13, 443-14, 443-15, and so on). It is appreciated that in the illustrated embodiment, a separation distance between connection pad 443-13 and 443-16 (e.g., active connection pads adjacent to one another and located along a common column) is greater than a separation distance between connection pad 443-13 and 443-14 (e.g., active connection pads adjacent to one another and located along a common row). The configuration of, the plurality of CPS structures 441 illustrated in FIG. 4C may have benefit of reducing crosstalk between adjacent connection pads without having much negative impact on signal conversion gain (e.g., dropping of conversion gain)

because of contribution of parasitic coupling capacitance between the active connection pad (e.g., connection pads 443-13, 443-14, 443-15, and so on) and the nearby CPS structures 441.

FIG. 4D illustrates a diagonal configuration of the plurality of CPS structures 441 (e.g., 441-19 through 441-21) disposed in the insulating medium 430, in accordance with an embodiment of the present disclosure. Specifically, the plurality of connection pads 443 (e.g., active connection pads 443-19 through 443-24 coupled to contacts/vias 497-19 through 497-24) are aligned in offset rows. This is achieved in part by having laterally adjacent connection pads included in the plurality of connection pads 443 (e.g., connection pad 443-20 is laterally adjacent to connection pads 443-19 and 443-23) have a common separation distance. For example, connection pad 443-20 is laterally separated from, but adjacent to, connection pad 443-19 by separation distance 451 while connection pad 443-20 is laterally separated from, but adjacent to, connection pad 443-23 by separation distance 452. In some embodiments, separation distance 451 is substantially equal (e.g., within 10% or otherwise based on manufacturing tolerances) to separation distance 452. It is further noted that diagonal separation distance (e.g., separation distance 453 between connection pad 443-20 and 443-21) between diagonally adjacent connection pads is less than the lateral separation distance, which is resultant from the offset arrangement of the plurality of connection pads 443. In such a configuration, the plurality of CPS structures 441 may be arranged diagonally with respect to the rows and columns of the plurality of connection pads 443 reducing coupling between neighboring or adjacent connection pads 443. As such, with the plurality of CPS structures 441 (e.g., 441-19 through 441-21) each configured to have illustrated diagonal configuration, the signal coupling between adjacent placement adjacent connection pads 443 during signal transmission operation can be further reduced. In addition, there can be no need for placement of inactive dummy connection pad as the placement of the plurality of CPS structures 441 can also provide processing advantage such as metal coverage to avoid the dishing effect that may result during layer planarization process (e.g., during a chemical mechanical polishing process). Additionally, it is appreciated that the plurality of CPS structures 441 may be arranged parallel to one another.

FIG. 4E illustrates a configuration where each active connection pad included in the plurality of connection pads 443 (e.g., active connection pads 443-25 through 443-30 coupled to contacts/vias 497-25 through 497-30) is laterally surrounded by a pair of CPS structures included in the plurality of CPS structures 441, in accordance with an embodiment of the disclosure. Specifically, each of the plurality of CPS structures 441 include two portions positioned between a given connection pad and adjacent rows included in the rows and an individual portion positioned between adjacent columns included in the columns. For example, CPS structure 441-24 includes row aligned portions 431 and 432 and column aligned portion 433. Row aligned portion 431 is disposed between connection pads 443-28 and 443-19DM disposed in different rows but a common column. Row aligned portion 432 is disposed between connection pad 443-29 and 443-23DM disposed in different rows but a common column. Column aligned portion 433 is disposed between connection pad 443-28 and 443-29 disposed in different columns but a common row. It is appreciated that pairs of CPS structures included in the plurality of CPS structures 441 may partially or completely surround a given connection pad included in the plurality of connection pads 443 (e.g., CPS structures 441-24 and 441-25 at least partially surround connection pad 443-29 within the insulating medium 430). It is appreciated that in some embodiments, one or more of the row aligned portions 431 and 432 and the column aligned portion 433 may be disposed in the same or different layer of insulating mediums within the insulating medium 430. For example, the plurality of CPS structures 441 may have configuration as depicted in FIG. 2B, wherein row aligned portions 431 and 432 may be formed or otherwise disposed in one insulating layer (e.g., first insulating layer 230-1) and column aligned portion 433 may be formed or otherwise disposed in in another insulating layer (e.g., second insulating layer 230-2) in FIG. 2B. In such an embodiment, the row aligned portions 431 and 432 and the column aligned portion 433 may be connected by one or more contacts/vias. It is appreciated that a separation distance between adjacent CPS structures included in the plurality of CPS structures 441 may be reduced such that the degree the given connection pad is surrounded is increased (e.g., up to the extent that the adjacent CPS structures directly contact one another or overlap each other) to provide complete encirclement. It is appreciated that inactive dummy connection pads (e.g., 443-19DM through 443-24DM) that are adjacent to one another are not laterally separated by one of the plurality of CPS structures 441. It is appreciated that the configuration of the plurality of CPS structures 441 illustrated in FIG. 4E may also have benefit of reducing crosstalk between adjacent active connection pads without having much negative impact on signal conversion gain (e.g., relative to the arrangement of CPS structures 441 depicted in FIG. 4A, which may be advantageous depending on the specific technical requirements of the stacked semiconductor device).

FIG. 4F-4H illustrate configurations of the plurality of CPS structures 441 where symmetry is maintained around a given connection pad included in the plurality of connection pads 443 when viewed from a plan view, in accordance with embodiments of the disclosure. For example, in FIG. 4F, CPS structure 441-32 is mirror symmetric with CPS structure 441-35 about axis 461 that extends diagonally through connection pad 443-34 when viewed from the illustrated plan view. Similar mirror symmetry may be found in the embodiments of FIGS. 4G and 4H, when an axis extends through a lateral dimension (e.g., aligned with columns or rows) of the plurality of connection pads 443 when viewed from the illustrated plan view.

FIG. 4F illustrates a configuration of the plurality of CPS structures 441 (e.g., 441-26 through 441-37) where adjacent CPS structures included in the plurality of CPS structures 441 are positioned diagonally cross from one another with respect to a given one of the plurality of connection pads 443 (e.g., 443-31 through 443-36 coupled to contacts/vias 497-31 through 497-36), in accordance with an embodiment of the disclosure. For example, CPS structure 441-26 is physically separated from, but disposed diagonally across to CPS structure 441-29. It is appreciated that individual CPS structures included in the plurality of CPS structures 441 illustrated in FIG. 4F have an "L" shape to partially surround or bracket a given connection pad. It is appreciated that inactive dummy connection pads (e.g., 443-25DM through 443-30DM) that are adjacent to one another are not laterally separated by one of the plurality of CPS structures 441. It is appreciated that the configuration of the plurality of CPS structures 441 illustrated in FIG. 4F may have benefit of reducing crosstalk between adjacent active connection pads while minimally increasing coupling capacitance, which may be an improvement over the arrangement of CPS structures 441 depicted in FIG. 4A depending on the targeted performance characteristics of the stacked semiconductor device.

FIG. 4G illustrates a configuration of the plurality of CPS structures 441 (e.g., 441-38 through 441-49) as enclosing brackets to laterally surround the plurality of connection pads 443 (e.g., 443-37 through 443-42 coupled to contacts/vias 497-37 through 497-42), in accordance with an embodiment of the disclosure. For example, CPS structures 441-38 and 441-39 collectively form enclosing brackets that extend towards each other such that distal ends of CPS structure 441-38 are closer to corresponding distal ends of CPS structure 441-39 in distance than respective midpoints of CPS structure 441-38 and 441-39. It is appreciated that inactive dummy connection pads (e.g., 443-31DM through 443-36DM) that are adjacent to one another are not laterally separated by one of the plurality of CPS structures 441.

FIG. 4H illustrates a configuration of the plurality of CPS structures 441 (e.g., 441-50 through 441-69) as separated line segments or disconnected segments that collectively surround a given connection pad included in the plurality of connection pads 443 (e.g., 443-43 through 443-48 coupled to contacts/vias 497-43 through 497-48), in accordance with an embodiment of the disclosure. The plurality of CPS structures 441 extend along a direction parallel with a given row or a given column of the plurality of connection pads as line segments. For example, CPS structures 441-50, 441-51, and 441-52 are positioned to extend along a direction parallel with a common row while CPS structures 441-53 and 441-63 extend along a direction parallel with a common column. In the illustrated embodiment, connection pad 443-43 is laterally surrounded by CPS structures 441-50, 441-53, 441-54, and 441-57. As illustrated, CPS structures 441-50 and 441-57 are parallel to one another while being orthogonal to CPS structures 441-53 and 441-54. Similarly, CPS structures 441-53 and 441-54 are parallel to one another. It is appreciated that inactive dummy connection pads (e.g., 443-37DM through 443-42DM) that are adjacent to one another are not laterally separated by one of the plurality of CPS structures 441.

It is appreciated that in some embodiments, configuration of the plurality of CPS structures 441 in FIG. 4G and FIG. 4H may facilitate ease of substrate alignment. For example, the separated line segments may be formed or otherwise disposed in separate insulating layers within the insulating medium 430. In one embodiment having a configuration of the plurality of CPS structures 441 shown in FIG. 4G, the pair of CPS structure 441-38 and CPS structure 441-39 that bracket active connection pad 443-37 may have arrangement configuration similar to that of FIG. 2B, where the CPS structure 441-38 and the CPS structure 441-39 may be formed or otherwise disposed in different insulating layers (e.g., CPS structure 441-38 formed in the first insulating layer 230-1 while CPS structure 441-39 may be formed or otherwise disposed in a different insulating layer than the CPS structure 441-38 such as the second insulating layer 230-2 or vice versa). Similarly, some of CPS structures 441-50, 441-53, 441-54, 441-57 that collectively surround active connection pad 443-43 may be formed or otherwise disposed in a first insulating layer (e.g., first insulating layer 230-1) while other CPS structures 441-50, 441-53, 441-54, 441-57 may be formed or otherwise disposed in a second insulating layer (e.g., second insulating layer 230-2) different from the first insulating layer.

It is appreciated that embodiments of the disclosure illustrated in FIGS. 1A-4H may be fabricated using conventional semiconductor device processing and microfabrication techniques known by one of ordinary skill in the art, which may include, but is not limited to, photolithography, ion implantation, chemical vapor deposition, physical vapor deposition, thermal evaporation, sputter deposition, reactive-ion etching, plasma etching, wafer bonding, chemical mechanical planarization, and the like. It is appreciated that the described techniques are merely demonstrative and not exhaustive and that other techniques may be utilized to fabricate one or more components of various embodiments of the disclosure.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A stacked semiconductor device, comprising:
a first semiconductor substrate and a second semiconductor substrate;
an insulating medium disposed between the first semiconductor substrate and the second semiconductor substrate;
a plurality of connection pads including a first connection pad and a second connection pad adjacent to the first connection pad, wherein the plurality of connection pads is disposed within the insulating medium and configured to provide one or more electrical connections extending between the first semiconductor substrate and the second semiconductor substrate; and
a first connection pad shield (CPS) structure, a second CPS structure, and a third CPS structure, each disposed within the insulating medium, wherein the first connection pad is disposed between the first CPS structure and the second CPS structure, wherein the plurality of connection pads are arranged in rows and columns to form a connection pad array, wherein the first connection pad and the second connection pad are included in a common row of the rows, and wherein the first connection pad and the third connection pad are included in a common column of the columns.

2. The stacked semiconductor device of claim 1, wherein the first CPS structure and the second CPS structure include a conductive material coupled to each receive a pre-determined voltage, and wherein the first CPS structure and the second CPS structure are positioned to mitigate crosstalk between the first connection pad and the second connection pad.

3. The stacked semiconductor device of claim 1, wherein the first CPS structure extends parallel to the second CPS structure.

4. The stacked semiconductor device of claim 3, wherein the first CPS structure and the second CPS structure each extend contiguously a distance greater than or equal to a summation of a first separation distance between the first connection pad and the third connection pad, a lateral dimension of the first connection pad, and a lateral dimension of the second connection pad.

5. The stacked semiconductor device of claim 1, wherein a first separation distance between the first connection pad and the third connection pad is greater than a second separation distance between the first connection pad and the second connection pad.

6. The stacked semiconductor device of claim 1, wherein a first separation distance between the first connection pad and the third connection pad is substantially equal to a second separation distance between the first connection pad and the second connection pad.

7. The stacked semiconductor device of claim 1, wherein the first CPS structure and the second CPS structure respectively form a first instance of a repeat pattern laterally surrounding the first connection pad, and wherein each other connection pad included in the plurality of connection pads is laterally surrounded by a corresponding instance of the repeat pattern.

8. The stacked semiconductor device of claim 7, wherein the first CPS structure is mirror symmetric with the second CPS structure about a reflection axis when viewed from a plan view.

9. The stacked semiconductor device of claim 7, further including a third connection pad and a fourth connection pad included in the plurality of connection pads, wherein the second connection pad and the fourth connection pad are included in a second common column of the columns, wherein a first portion of the first CPS structure is disposed between the first connection pad and the third connection pad, and wherein a second portion of the first CPS structure is disposed between the second connection pad and the fourth connection pad.

10. The stacked semiconductor device of claim 7, wherein corresponding lengths of the first CPS structure and the second CPS structure are greater than a lateral dimension of the first connection pad.

11. The stacked semiconductor device of claim 7, further comprising a plurality of dummy connection pads disposed in the insulating medium and electrically isolated from the first semiconductor substrate and the second semiconductor substrate, wherein one or more dummy pads included in the plurality of dummy connection pads are disposed between adjacent rows included in the rows of the connection pad array.

12. The stacked semiconductor device of claim 7, wherein the first CPS structure is positioned diagonally across from the second CPS structure when viewed from a plan view, wherein the first CPS structure is physically separated from the second CPS structure.

13. The stacked semiconductor device of claim 7, wherein the first CPS structure and the second CPS structure collectively form enclosing brackets that extend towards each other such that distal ends of the first CPS structure are closer to corresponding distal ends of the second CPS structure in distance than respective midpoints of the first and the second CPS structures.

14. The stacked semiconductor device of claim 7, further comprising a third CPS structure and a fourth CPS structure that in combination with the first CPS structure and the second CPS structure form an instance of the repeat pattern, wherein the first CPS structure, the second CPS structure, the third CPS structure, and the fourth CPS structure are each physically separated from one another, wherein the first CPS structure is orthogonal to the second CPS structure and the fourth CPS structure, and wherein the first CPS structure is parallel to the third CPS structure.

15. The stacked semiconductor device of claim 1, further comprising:

a plurality of pixel cells for imaging an external scene, each disposed in or on the first semiconductor substrate; and a pixel cell circuitry disposed in or on the second semiconductor substrate, wherein the pixel cell circuitry is coupled to the plurality of pixel cells via the plurality of connection pads, wherein the plurality of pixel cells includes a first floating diffusion region included in a first pixel cell and a second floating diffusion region included in a second pixel cell, wherein the first connection pad is coupled to the first floating diffusion region and the second connection pad is coupled to the second floating diffusion region.

16. A stacked semiconductor device, comprising:

a first semiconductor substrate and a second semiconductor substrate;

an insulating medium disposed between the first semiconductor substrate and the second semiconductor substrate;

a plurality of connection pads including a first connection pad and a second connection pad adjacent to the first connection pad, wherein the plurality of connection pads is disposed within the insulating medium and configured to provide one or more electrical connections extending between the first semiconductor substrate and the second semiconductor substrate;

a first connection pad shield (CPS) structure and a second CPS structure, each disposed within the insulating medium, wherein the first connection pad is disposed between the first CPS structure and the second CPS structure, wherein the first CPS structure and the second CPS structure respectively form a first instance of a repeat pattern laterally surrounding the first connection pad, and wherein each other connection pad included in the plurality of connection pads is laterally surrounded by a corresponding instance of the repeat pattern; and a bonding interface located where a first insulating layer, included in the insulating medium, coupled to the first semiconductor substrate interfaces with a second insulating layer, included in the insulating medium, coupled to the second semiconductor substrate, wherein the first CPS structure extends from the bonding interface towards the first semiconductor substrate such that the first CPS structure directly contacts the second insulating layer at the bonding interface, and wherein the second CPS structure extends from the bonding interface towards the second semiconductor substrate such that the second CPS structure directly contacts the first insulating layer at the bonding interface.

17. The stacked semiconductor device of claim 16, further comprising a plurality of dummy connection pads disposed in the insulating medium and electrically isolated from the first semiconductor substrate and the second semiconductor substrate, wherein the plurality of connection pads is arranged in rows and columns to form a connection pad array, wherein one or more dummy pads included in the plurality of dummy connection pads are disposed between adjacent rows included in the rows of the connection pad array.

18. The stacked semiconductor device of claim 16, wherein the first CPS structure is positioned diagonally across from the second CPS structure when viewed from a plan view, wherein the first CPS structure is physically separated from the second CPS structure.

19. The stacked semiconductor device of claim 16, wherein the first CPS structure and the second CPS structure collectively form enclosing brackets that extend towards each other such that distal ends of the first CPS structure are closer to corresponding distal ends of the second CPS structure in distance than respective midpoints of the first and the second CPS structures.

20. An image sensor for imaging an external scene, the image sensor comprising:

a first semiconductor substrate including a plurality of pixel cells, each disposed in or on the first semiconductor substrate and including at least one photodiode;

a second semiconductor substrate including a pixel cell circuitry disposed in or on the second semiconductor substrate for pixel cell readout; and an insulating medium disposed between the first semiconductor substrate and the second semiconductor substrate, the insulating medium including:

a plurality of connection pads including a first connection pad and a second connection pad adjacent to the first connection pad, wherein the plurality of connection pads is disposed within the insulating medium and configured to provide one or more electrical connections extending between the first semiconductor substrate and the second semiconductor substrate, wherein the pixel cell circuitry is coupled to the plurality of pixel cells via the plurality of connection pads; and a first connection pad shield (CPS) structure and a second CPS structure, each disposed within the insulating medium, wherein the first connection pad is disposed between the first CPS structure and the second CPS structure, and wherein the first CPS structure is directly coupled to the second CPS structure to laterally encapsulate the first connection pad within the insulating medium.

* * * * *